United States Patent
Terai

(10) Patent No.: US 10,297,642 B2
(45) Date of Patent: May 21, 2019

(54) SEMICONDUCTOR DEVICE HAVING DATA STORAGE PATTERN

(71) Applicant: Samsung Electronics Co., Ltd., Suwon-si, Gyeonggi-do (KR)

(72) Inventor: Masayuki Terai, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 2 days.

(21) Appl. No.: 15/671,735

(22) Filed: Aug. 8, 2017

(65) Prior Publication Data

US 2018/0286919 A1  Oct. 4, 2018

(30) Foreign Application Priority Data

Mar. 28, 2017 (KR) .................. 10-2017-0039012

(51) Int. Cl.
*H01L 45/00* (2006.01)
*H01L 27/24* (2006.01)

(52) U.S. Cl.
CPC ........ *H01L 27/249* (2013.01); *H01L 27/2427* (2013.01); *H01L 45/065* (2013.01); *H01L 45/126* (2013.01); *H01L 45/1233* (2013.01); *H01L 45/141* (2013.01); *H01L 45/1683* (2013.01)

(58) Field of Classification Search
CPC . H01L 45/126; H01L 45/1233; H01L 45/065; H01L 27/2427; H01L 27/249; H01L 45/1683; H01L 45/141
See application file for complete search history.

(56) References Cited

U.S. PATENT DOCUMENTS

| 7,995,374 | B2 | 8/2011 | Komura et al. |
| 8,084,789 | B2 * | 12/2011 | Pellizzer ............. H01L 27/2427 257/214 |
| 8,502,182 | B2 | 8/2013 | Liu et al. |

(Continued)

OTHER PUBLICATIONS

Ciocchini et al., "Universal thermoelectric characteristic in phase change memories," 2015 IEEE International, Memory Workshop, 4 pages.

*Primary Examiner* — Jarrett J Stark
*Assistant Examiner* — Charles N Ausar-El
(74) *Attorney, Agent, or Firm* — Sughrue Mion, PLLC

(57) ABSTRACT

A semiconductor device including a data storage pattern is provided. The semiconductor device includes a first conductive line disposed on a substrate and extending in a first direction, a second conductive line disposed on the first conductive line and extending in a second direction, and a first data storage structure and a first selector structure disposed between the first conductive line and the second conductive line and connected in series. The first data storage structure includes a first lower data storage electrode, a first data storage pattern, and a first upper data storage electrode. The first lower data storage electrode includes a first portion facing the first upper data storage electrode and vertically aligned with the first upper data storage electrode. The first data storage pattern includes a first side surface and a second side surface facing each other. The first upper data storage electrode and the first portion of the first lower data storage electrode are disposed to be closer to the first side surface of the first data storage pattern than to the second side surface of the first data storage pattern.

20 Claims, 52 Drawing Sheets

(56) References Cited

U.S. PATENT DOCUMENTS

| | | | |
|---|---|---|---|
| 8,541,768 B2 * | 9/2013 | Shima | H01L 27/2409 257/2 |
| 8,830,739 B2 * | 9/2014 | Oh | H01L 45/04 365/148 |
| 9,029,828 B2 | 5/2015 | Oh | |
| 9,123,415 B2 | 9/2015 | Liu | |
| 9,177,643 B2 | 11/2015 | Kim | |
| 9,257,431 B2 | 2/2016 | Ravasio et al. | |
| 9,741,764 B1 * | 8/2017 | Terai | H01L 27/2481 |
| 9,853,211 B2 * | 12/2017 | Sills | H01L 45/065 |
| 10,128,315 B2 * | 11/2018 | Russo | H01L 27/2445 |
| 10,153,433 B2 * | 12/2018 | Redaelli | H01L 45/1293 |
| 2007/0063180 A1 | 3/2007 | Asano et al. | |
| 2009/0196091 A1 * | 8/2009 | Kau | H01L 27/2427 365/163 |
| 2010/0259961 A1 * | 10/2010 | Fasoli | B82Y 10/00 365/51 |
| 2011/0272663 A1 * | 11/2011 | An | H01L 45/04 257/4 |
| 2013/0062589 A1 * | 3/2013 | Yasutake | H01L 27/1021 257/4 |
| 2014/0328109 A1 * | 11/2014 | Murooka | G11C 8/10 365/148 |
| 2015/0084156 A1 * | 3/2015 | Ravasio | H01L 45/04 257/528 |
| 2015/0103582 A1 * | 4/2015 | Okawa | H01L 27/249 365/148 |
| 2015/0333103 A1 * | 11/2015 | Toh | H01L 45/06 257/5 |
| 2015/0364678 A1 * | 12/2015 | Wu | H01L 45/06 438/382 |
| 2017/0243919 A1 * | 8/2017 | Seong | H01L 27/249 |
| 2017/0271580 A1 * | 9/2017 | Park | H01L 27/224 |
| 2017/0271592 A1 * | 9/2017 | Lee | H01L 27/2427 |
| 2017/0294483 A1 * | 10/2017 | Terai | H01L 27/2427 |
| 2017/0338409 A1 * | 11/2017 | Lee | H01L 45/10 |
| 2018/0019281 A1 * | 1/2018 | Lee | H01L 27/2427 |
| 2018/0342671 A1 * | 11/2018 | Sills | G11C 11/221 |

* cited by examiner

SEMICONDUCTOR DEVICE HAVING DATA STORAGE PATTERN

CROSS-REFERENCE TO RELATED APPLICATION

This application claims the priority and benefit of Korean Patent Application No. 10-2017-0039012, filed on Mar. 28, 2017, with the Korean Intellectual Property Office, the inventive concept of which is incorporated herein by reference.

FIELD

The present inventive concept relates to a semiconductor device, and more particularly, to a semiconductor device having a data storage pattern.

BACKGROUND

A phase change random access memory (PRAM) devices and resistive random access memory (RRAM) devices use an information storage material which can change the resistance value according to the current or voltage and can maintain the resistance value even if the current or voltage supply is interrupted. In order to increase the degree of integration of memory devices such as PRAM or RRAM, three-dimensionally arranged memory cells are developed.

SUMMARY

In accordance with an example embodiment of the inventive concepts, a semiconductor device includes a first conductive line disposed on a substrate and extending in a first direction, parallel to a surface of the substrate, a second conductive line disposed on the first conductive line and extending in a second direction, perpendicular to the first direction and parallel to the surface of the substrate, and a first data storage structure and a first selector structure disposed between the first conductive line and the second conductive line and connected in series. The first data storage structure includes a first lower data storage electrode, a first data storage pattern disposed on the first lower data storage electrode, and a first upper data storage electrode disposed on the first data storage pattern, the first lower data storage electrode includes a first portion facing the first upper data storage electrode and vertically aligned with the first upper data storage electrode, the first data storage pattern includes a first side surface and a second side surface facing each other, and the first upper data storage electrode and the first portion of the first lower data storage electrode are disposed to be closer to the first side surface of the first data storage pattern than to the second side surface of the first data storage pattern.

In accordance with an example embodiment of the inventive concepts, a semiconductor device includes a first conductive line disposed on a substrate and extending in a first direction, parallel to a surface of the substrate, a second conductive line disposed on the first conductive line and extending in a second direction, perpendicular to the first direction and parallel to the surface of the substrate, and a first data storage structure interposed between the first conductive line and the second conductive line. The first data storage structure includes a first lower data storage electrode, a first data storage pattern, and a first upper data storage electrode, sequentially arranged in a direction perpendicular to the surface of the substrate, the first data storage pattern includes a first side surface and a second side surface facing each other, and the first upper data storage electrode is disposed closer to the first side surface of the first data storage pattern than to the second side surface of the first data storage pattern.

In accordance with an example embodiment of the inventive concepts, a semiconductor device includes a first word line disposed on a substrate and extending in a first direction, parallel to a surface of the substrate, a bit line disposed on the first word line and extending in a second direction, perpendicular to the first direction and parallel to the surface of the substrate, a second word line disposed on the bit line and extending in the first direction, a first data storage structure between the first word line and the bit line, and a second data storage structure between the bit line and the second word line. The first data storage structure includes a first lower data storage electrode, a first data storage pattern, and a first upper data storage electrode, sequentially arranged in a direction perpendicular to the surface of the substrate. A first portion of the first lower data storage electrode has a width in the first direction and a length in the second direction greater than the width in the first direction. The first upper data storage electrode has the same width in the first direction and the same length in the second direction as the first portion of the first lower data storage electrode. A width of the first data storage pattern in the first direction is greater than the width of the first portion of the first lower data storage electrode in the first direction.

BRIEF DESCRIPTION OF DRAWINGS

The above and other aspects, features, and advantages of the present inventive concept will be more clearly understood from the following detailed description taken in conjunction with the accompanying drawings, in which.

DETAILED DESCRIPTION

Figure 1:
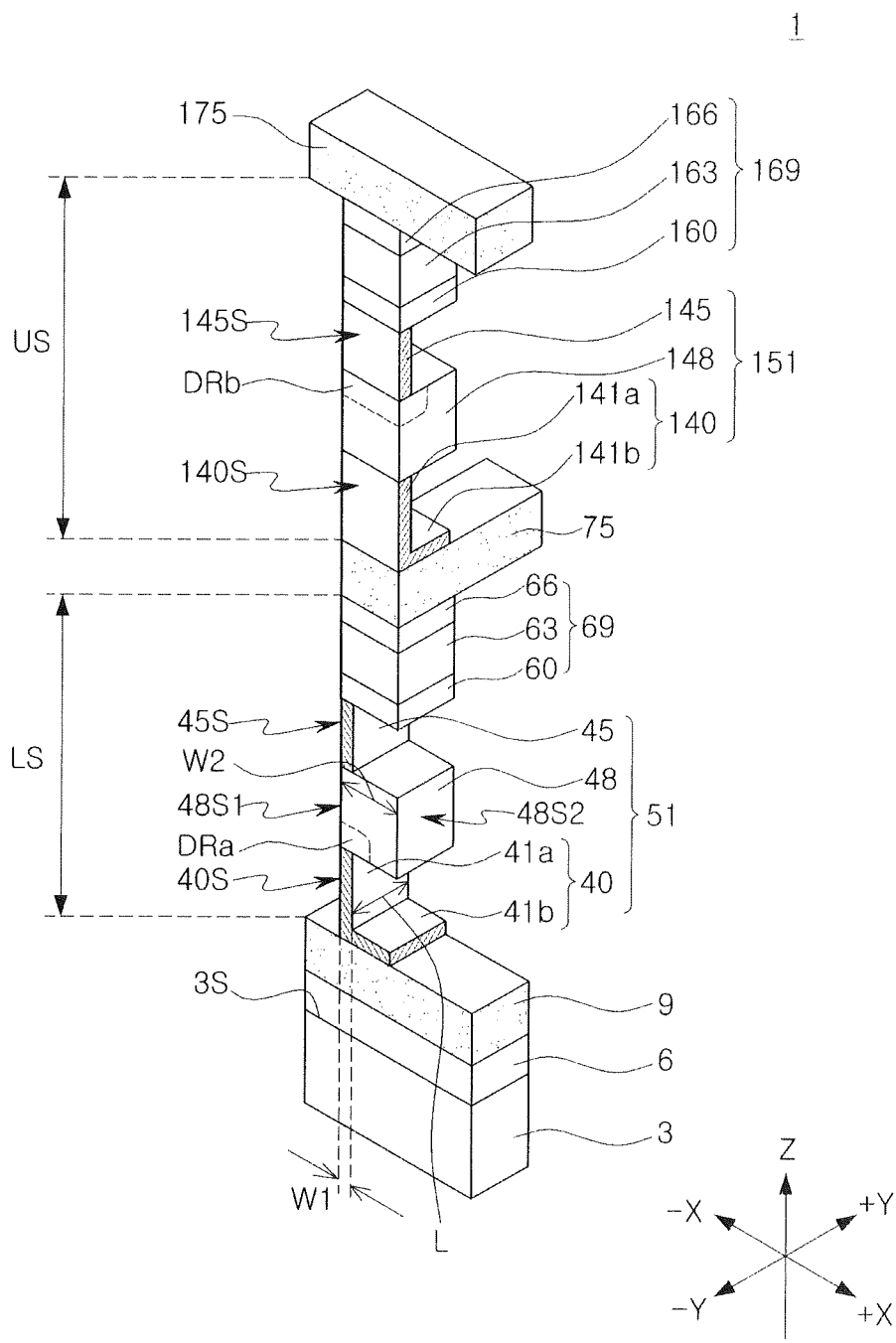
FIG. 1 is a perspective view illustrating a semiconductor device according to an example embodiment of the present inventive concept.

Hereinafter, semiconductor devices according to example embodiments of the present inventive concept will be described with reference to the accompanying drawings. First, a semiconductor device according to an example embodiment of the present inventive concept will be described with reference to FIG. 1. FIG. 1 is a schematic perspective view illustrating a semiconductor device according to an example embodiment of the present inventive concept.

Referring to FIG. 1, a semiconductor device 1 according to an example embodiment of the present inventive concept may include a first memory region LS and a second memory region US on a substrate 3. The first memory region LS and the second memory region US may be sequentially arranged in a direction Z, perpendicular to a surface 3S of the substrate 3. The substrate 3 may be a semiconductor substrate.

The semiconductor device 1 according to the example embodiment of the present inventive concept may include a first conductive line 9 arranged between the substrate 3 and the first memory region LS, a second conductive line 75 arranged between the first memory region LS and the second memory region US, and a third conductive line 175 arranged on the second memory region US.

The first conductive line 9 may be arranged on a base insulating layer 6 disposed on the substrate 3 to have a line shape extending in a first direction X parallel to the surface 3S of the substrate 3. The base insulating layer 6 may be formed of silicon oxide. The second conductive line 75 may have a line shape extending in a second direction Y, parallel to the surface 3S of the substrate 3 and perpendicular to the first direction X. The third conductive line 175 may have a line shape extending in the first direction X and overlapping the first conductive line 9.

Each of the first, second, and third conductive lines 9, 75, and 175 may be formed of a conductive material, such as a doped silicon, a metal (e.g. W), a metal nitride (e.g. TiN or WN), and/or a metal silicide (e.g. WSi or TSi).

The first memory region LS may include a first data storage structure 51 and first selector structure 69 connected in series, and the second memory region US may include a second data storage structure 151 and second selector structure 169 connected in series. The first selector structure 69 may be arranged on the first data storage structure 51, and the second selector structure 169 may be arranged on the second data storage structure 151.

In some example embodiments, the first memory region LS may be referred to as a lower memory region or a lower memory structure, and the second memory region US may be referred to as an upper memory region or an upper memory structure. In addition, the first data storage structure 51 and the second data storage structure 151 may be respectively referred to as a lower data storage structure and an upper data storage structure, and the first selector structure 69 and the second selector structure 169 may be respectively referred to as a lower selector structure and an upper selector structure.

The first data storage structure 51 may include a first lower data storage electrode 40, a first data storage pattern 48, and a first upper data storage electrode 45, sequentially arranged in the direction Z, perpendicular to the surface 3S of the substrate 3, and the second data storage structure 151 may include a second data storage electrode 140, a second data storage pattern 148, and a second upper data storage electrode 145, sequentially arranged in the direction Z perpendicular to the surface 3S of the substrate 3.

The first lower data storage electrode 40 may include a first portion 41a and a second portion 41b. The second portion 41b of the first lower data storage electrode 40 may be spaced apart from the first data storage pattern 48, in contact with the first conductive line 9, and extending in the first direction X. The second portion 41b of the first lower data storage electrode 40 may overlap the first data storage pattern 48. The first portion 41a of the first lower data storage electrode 40 may extend from an end of the second portion 41b in the direction Z, perpendicular to the surface 3S of the substrate 3, and may be in contact with the first data storage pattern 48. That is, the second portion 41b of the first lower data storage electrode 40 may extend from a bottom of the first portion 41a, in the first direction X. Accordingly, the first lower data storage electrode 40 may have an L-shape, wherein the first portion 41a may be a vertical portion of the L-shape, and the second portion 41b may be a horizontal portion of the L-shape. In the first lower data storage electrode 40, a thickness of the second portion 41b in the direction Z perpendicular to the surface 3S of the substrate 3 may be the same as a width W1 of the first portion 41a in the first direction X.

The first upper data storage electrode 45 may be self-aligned to the first portion 41*a* of the first lower data storage electrode 40. Side surfaces 45S of the first upper data storage electrode 45 may be vertically aligned with side surfaces 40S of the first portion 41*a* of the first lower data storage electrode 40. The first portion 41*a* of the first lower data storage electrode 40 may have the width W1 in the first direction X, and a length L in the second direction Y greater than the width W1 in the first direction X. The first upper data storage electrode 45 may have the width W1 in the first direction X and the length L in the second direction Y, the same as those of the first portion 41*a* of the first lower data storage electrode 40. Accordingly, facing surfaces of the first upper data storage electrode 45 and the first lower data storage electrode 40 may have the same size.

The first data storage pattern 48 may be in contact with the first upper data storage electrode 45 and the first portion 41*a* of the first lower data storage electrode 40. A width W2 of the first data storage pattern 48 in the first direction X may be greater than the width W1 of the first upper data storage electrode 45 and the first portion 41*a* of the first lower data storage electrode 40 in the first direction X. The first data storage pattern 48 may include a first side surface 48S1 and second side surface 48S2, opposed to each other. The first side surface 48S1 and the second side surface 48S2 may be sequentially arranged in the first direction X.

In the first data storage pattern 48, the first side surface 48S1 may be closer to the first upper data storage electrode 45 and the first portion 41*a* of the first lower data storage electrode 40 than the second side surface 48S2. The first data storage pattern 48 may extend from a portion in contact with the first upper data storage electrode 45 and the first portion 41*a* of the first lower data storage electrode 40, in the first direction X. The second portion 41*b* of the first lower data storage electrode 40 may extend from a portion in contact with the first portion 41*a*, in the first direction X. A portion of the first data storage pattern 48 extending in the first direction X may overlap the second portion 41*b* of the first lower data storage electrode 40.

In some example embodiments, the first lower data storage electrodes 40, the first data storage patterns 48, and the first upper data storage electrodes 45 may respectively have side surfaces 40S, 48S1, and 45S, vertically aligned.

The second data storage structure 151 may have a shape formed by rotating the same structure as the first data storage structure 51 90 degrees in a direction parallel to the surface 3S of the substrate 3. Accordingly, the second data storage structure 151 may include the second data storage electrode 140 corresponding to the first lower data storage electrode 40, the second data storage pattern 148 corresponding to the first data storage pattern 48, and the second upper data storage electrode 145 corresponding to the first upper data storage electrode 45. Accordingly, since the second data storage electrode 140 has the shape formed by rotating the same structure as the first data storage structure 51 90 degrees in the direction parallel to the surface 3S of the substrate 3, the second data storage electrode 140 may include a second portion 141*b* in contact with the second conductive line 75 and extending in the second direction Y perpendicular to the first direction X, and a first portion 141*a* extending from a portion of the second portion 141*b* in the third direction Z and in contact with the second data storage pattern 148. A side surface 140S of the second data storage electrode 140 may be vertically aligned with the side surface 145S of the second upper data storage electrode 145.

The first selector structure 69 may include a first lower selector electrode 60, a first selector pattern 63, and a first upper selector electrode 66, sequentially arranged in the direction Z perpendicular to the surface 3S of the substrate 3, and the second selector structure 169 may include a second lower selector electrode 160, a second selector pattern 163, and a second upper selector electrode 166, sequentially arranged in the third direction Z. The first lower selector electrode 60 may be electrically connected to the first upper data storage electrode 45, and the first upper selector electrode 66 may be electrically connected to the second conductive line 75. The second lower selector electrode 160 may be electrically connected to the second upper data storage electrode 145, and the second upper selector electrode 166 may be electrically connected to the third conductive line 175.

The first selector structure 69 may overlap the first data storage pattern 48, and the second selector structure 169 may overlap the second data storage pattern 148. One of the opposite side surfaces of the first selector structure 69 may be closer to the first upper data storage electrode 45 than the other of the opposite side surfaces of the first selector structure 69. Likewise, one of the opposite side surfaces of the second selector structure 169 may be closer to the second upper data storage electrode 145 than the other of the opposite side surfaces of the second selector structure 169.

The first and second data storage patterns 48 and 148 may be formed of the same phase change material. The first and second data storage patterns 48 and 148 may be formed of a phase change memory material, which undergoes phase transition from a non-crystalline phase with higher resistivity to a crystalline phase with lower resistivity or from a crystalline phase to a non-crystalline phase depending on heating temperature and time when a current is applied. For example, the phase change memory material used as the first and second data storage patterns 48 and 148 may be a chalcogenide material including Ge, Sb, and/or Te. Alternatively, the phase change memory material may be a material including at least one of Te and Se, and at least one of Ge, Sb, Bi, Pb, Sn, As, S, Si, P, O, N, and In.

The first data storage pattern 48 may include a first phase change region or a first data storage region DRa, which undergoes the phase transition from a non-crystalline phase with higher resistivity to a crystalline phase with lower resistivity or from a crystalline phase to a non-crystalline phase depending on heating temperature and time when a current is applied. Likewise, the second data storage pattern 148 may include a second phase change region or a second data storage region DRb, which undergoes the phase transition from a non-crystalline phase with higher resistivity to a crystalline phase with lower resistivity or from a crystalline phase to a non-crystalline phase depending on heating temperature and time when a current is applied. Accordingly, the first and second data storage regions DRa and DRb may be data storage regions of a phase change memory device. Therefore, the semiconductor device 1 according to the example embodiment of the present inventive concept may be the phase change memory device.

The first data storage region DRa of the first data storage pattern 48 may be in contact with the first portion 41*a* of the first lower data storage electrode 40, and the second data storage region DRb of the second data storage pattern 148 may be in contact with the second upper data storage electrode 145. The first data storage region DRa may be spaced apart from the first upper data storage electrode 45, and the second data storage region DRb may be spaced apart from the second data storage electrode 140.

The first and second lower data storage electrodes 40 and 140 and the first and second upper data storage electrodes 45 and 145 may be formed of the same conductive material. For example, the first and second lower data storage electrodes 40 and 140 and the first and second upper data storage electrodes 45 and 145 may be formed of a conductive material including TiN, TaN, WN, MoN, TiSiN, TiCN, TiBN, ZrSiN, WSiN, WBN, ZrAlN, MoAlN, TaSiN, TaAlN, TiON, TiAlON, WON, TaON, or a combination thereof.

The first and second selector patterns 63 and 163 may be threshold switching devices. For example, the first and second selector patterns 63 and 163 may be ovonic threshold switching device.

The first and second selector patterns 63 and 163 may be formed of a chalcogenide-based material different from the chalcogenide material used in the first and second data storage patterns 48 and 148. For example, the first and second data storage patterns 48 and 148 may be formed of a phase change memory material (e.g. an alloy of Ge, Sb and/or Te) which undergoes the phase transition from a crystalline phase to a non-crystalline phase or from a non-crystalline phase to a crystalline phase during an operation of the semiconductor device 1, and the first and second selector patterns 63 and 163 may be formed of a chalcogenide-based ovonic threshold switching material which maintains a non-crystalline phase during the operation of the semiconductor device 1. The first and second selector patterns 63 and 163 may not be crystallized from the non-crystalline phase even when a voltage greater than a threshold voltage Vth is applied to switch an ON state to an OFF state.

The first and second selector patterns 63 and 163 may include an alloy material including at least two of As, S, Se, Te, and Ge. In addition to the alloy material, the first and second selector patterns 63 and 163 may further include an element, such as Si or N, which maintains the non-crystalline phase at a higher temperature. Alternatively, the threshold switching devices may be formed of one of an alloy including Te, As, Ge, and Si, an alloy including Ge, Te, and Pb, an alloy including Ge, Se, and Te, an alloy including Al, As, and Te, an alloy including Se, As, Ge, and Si, an alloy including Se, As, Ge, and C, an alloy including Se, Te, Ge, and Si, an alloy including Ge, Sb, Te, and Se, an alloy including Ge, Bi, Te, and Se, an alloy including Ge, As, Sb, and Se, an alloy including Ge, As, Bi, and Te, and an alloy including Ge, As, Bi and Se.

The first and second selector patterns 63 and 163 as threshold switching devices may be switched from the OFF state to the ON state when a voltage the same as or greater than the threshold voltage Vth is applied. Accordingly, since the first and second selector patterns 63 and 163 as the threshold switching devices are switched using the threshold voltage Vth, the first and second selector patterns 63 and 163 may be used as a selector or a switch device of the semiconductor device 1. For example, the first and second selector patterns 63 and 163 as the threshold switching devices may be used as a selector or switch device of a memory cell array of a semiconductor device such as a phase change memory device.

The first conductive line 9 may be a first word line, the third conductive line 175 may be a second word line, and the second conductive line 75 may be a bit line. Accordingly, since the first and third conductive lines 9 and 175 are the word lines and the second conductive line 75 is the bit line, the first portion 41a of the first lower data storage electrode 40 may function as a heater heating the first data storage region DRa of the first data storage pattern 48, and the second upper data storage electrode 145 may function as a heater heating the second data storage region DRb of the second data storage pattern 148.

As described above, facing surfaces of the first portion 41a of the first lower data storage electrode 40 and the second upper data storage electrode 145 may have the same size. Accordingly, the first data storage region DRa in contact with the first portion 41a of the first lower data storage electrode 40 functioning as a lower heater may have substantially the same size as the second data storage region DRb in contact with the second upper data storage electrode 145 functioning as an upper heater. Accordingly, since the first data storage region DRa and the second data storage region DRb are symmetrical to each other on the basis of the second conductive line 75 functioning as the bit line and have the same size, memory operation characteristics of the first memory region LS may be the same as those of the second memory region US. Accordingly, scattering of cell characteristics of the first memory region LS and the second memory region US, arranged three-dimensionally, may be reduced.

In addition, since the first memory region and the second memory region are formed to be symmetrical to each other on the basis of the second conductive line 75 functioning as the bit line, the first memory region and the second memory region may be operated under the same conditions.

At least a portion of the components of the semiconductor device 1 according to the example embodiment of the present inventive concept, described with reference to FIG. 1, may be modified. Components that can be modified within the scope of the present inventive concept will be described with reference to the following drawings. Hereinafter, when describing modified components of a semiconductor device, components that are not modified or use the same terminology may be understood as being those described previously, even in the case that they are not subsequently described separately.

Figure 2:
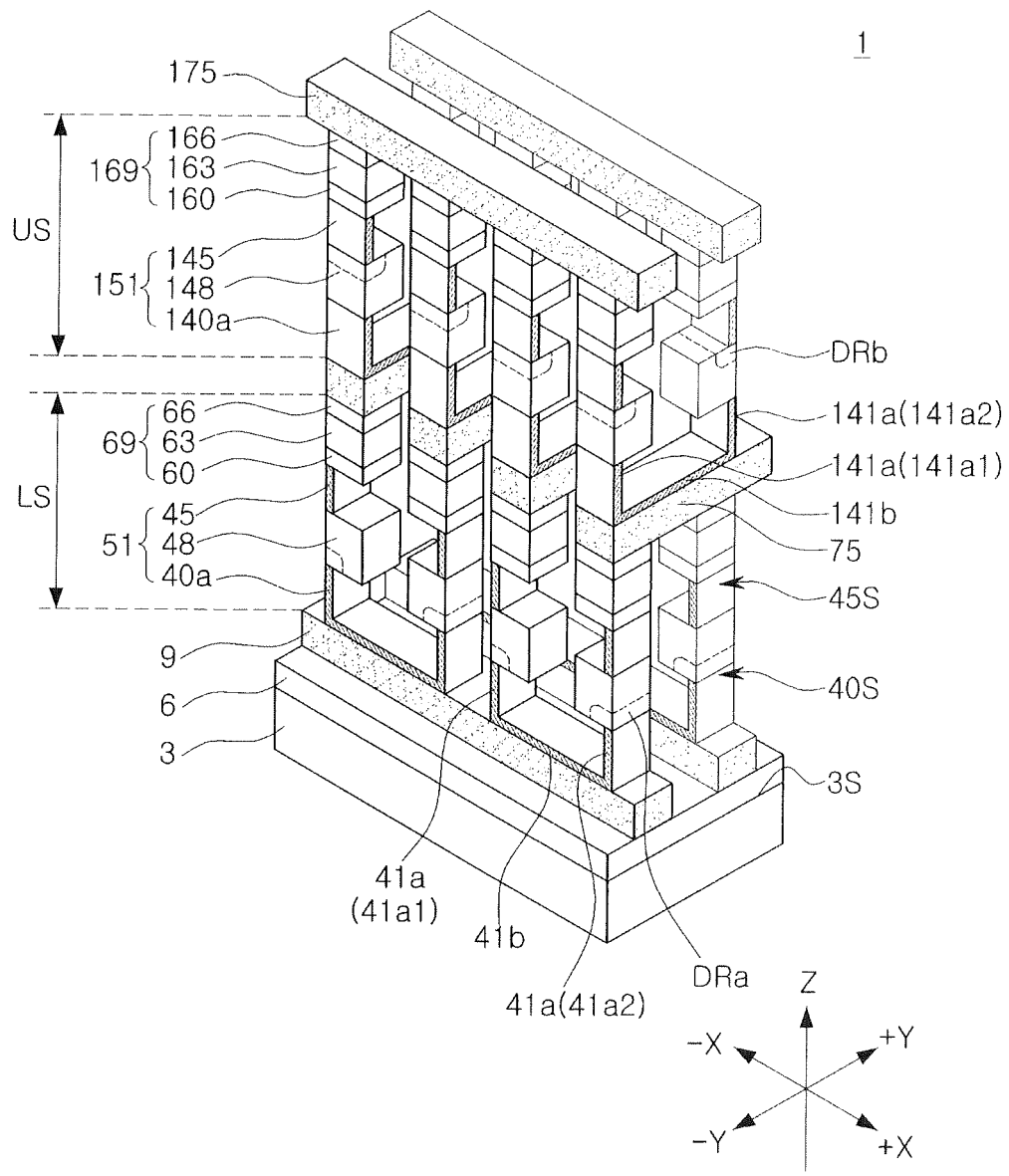
FIG. 2 is a perspective view illustrating a semiconductor device according to an example embodiment of the present inventive concept.

First, a modified example of the semiconductor device 1 according to the example embodiment of the present inventive concept, described with reference to FIG. 1, will be described with reference to FIG. 2. FIG. 2 is a perspective view illustrating a semiconductor device according to an example embodiment of the present inventive concept.

Referring to FIG. 2, a plurality of first conductive lines 9 extending in the first direction X, a plurality of second conductive lines 75 extending in the second direction Y, and a plurality of third conductive lines 175 extending in the first direction X may be arranged on the base insulating layer 6 disposed on the substrate 3. The plurality of first conductive lines 9 may be parallel to and spaced apart from each other. The plurality of second conductive lines 75 may be parallel to and spaced apart from each other. The plurality of third conductive lines 175 may overlap the plurality of first conductive lines 9.

A first memory region LS disposed between the first and second conductive lines 9 and 75 may include a plurality of first data storage structures 51 and a plurality of first selector structures 69. Each of the plurality of first data storage structures 51 may be connected to each of the plurality of first selector structures 69, in series. Each of the plurality of first data storage structures 51 may include a first lower data storage electrode 40a, a first data storage pattern 48, and a first upper data storage electrode 45.

Each of the first lower data storage electrodes 40a may include a first portion 41a and a second portion 41b. Among the first lower data storage electrodes 40a, a pair of first lower data storage electrodes 40a arranged on one of the first conductive lines 9 and facing each other, may include a pair of first portions 41a1 and 41a2 facing each other, and a second portion 41b connecting bottoms of the pair of first portions 41a1 and 41a2. In the first lower data storage electrodes 40a, the pair of first portions 41a1 and 41a2 may share one second portion 41b connecting the bottoms of the pair of first portions 41a1 and 41a2. Accordingly, the pair of first lower data storage electrodes 40a may be repeatedly arranged on one of the first conductive lines 9.

The first data storage patterns 48 of the plurality of first data storage structures 51 may be arranged on the first portions 41a of the first lower data storage electrodes 40. Each of the first data storage patterns 48 may be the same as the first data storage pattern 48 described with reference to FIG. 1. Accordingly, each of the first data storage patterns 48 may include the first data storage region DRa described with reference to FIG. 1.

Each of the first upper data storage electrodes 45 may be the same as the first upper data storage electrode 45 described with reference to FIG. 1. Each of the first selector structures 69 may include the first lower selector electrode 60, the first selector pattern 63, and the first upper selector electrode 66, described with reference to FIG. 1.

A second memory region US arranged between the second and third conductive lines 75 and 175 may include a plurality of second data storage structures 151 and a plurality of second selector structures 169. Each of the plurality of second data storage structures 151 may include a second lower data storage electrode 140a, a second data storage pattern 148, and a second upper data storage electrode 145. The second data storage pattern 148 may include the second data storage region DRb described with reference to FIG. 1. Each of the second selector structures 169 may include the second lower selector electrode 160, the second selector pattern 163, and the second upper selector electrode 166, described with reference to FIG. 1.

Among the second lower data storage electrode 140a, a pair of second lower data storage electrodes 140a disposed on one of the second conductive lines 75 and facing each other may include a pair of first portions 141a1 and 141a2 facing each other and a second portion 141b connecting bottoms of the pair of first portions 141a1 and 141a2. The second conductive lines 75 may have a shape formed by rotating the first conductive lines 9 90 degrees in the direction parallel to the surface 3S of the substrate 3, and the second lower data storage electrodes 140a may have a shape formed by rotating the first lower data storage electrodes 40a 90 degrees in the direction parallel to the surface 3S of the substrate 3. Likewise, the second memory region US may have a shape formed by rotating the first memory region LS 90 degrees in the direction parallel to the surface 3S of the substrate 3.

Figure 3A:
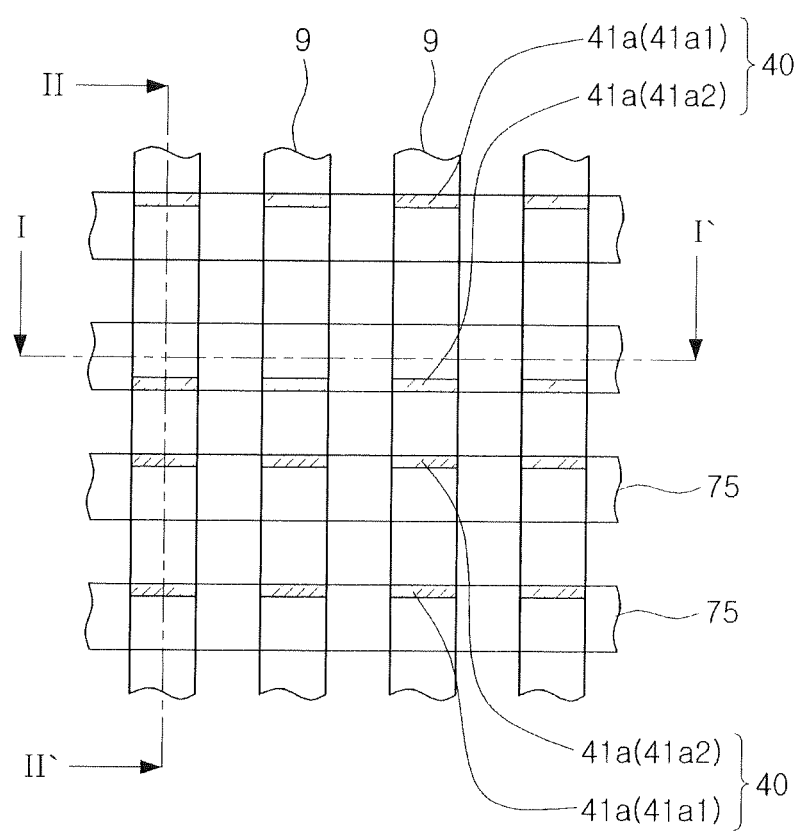
FIGS. 3A and 3B are plan views illustrating a modified example of a semiconductor device according to an example embodiment of the present inventive concept.
Figure 3B:
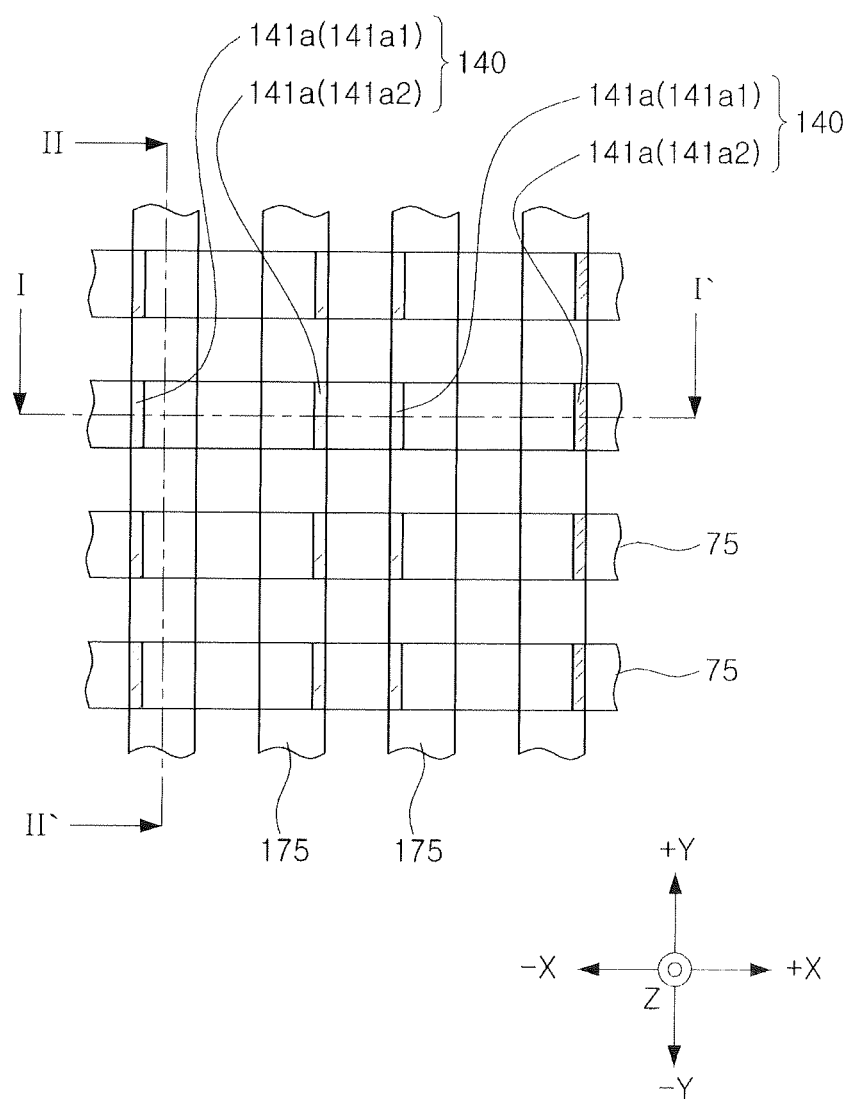
Figure 4A:
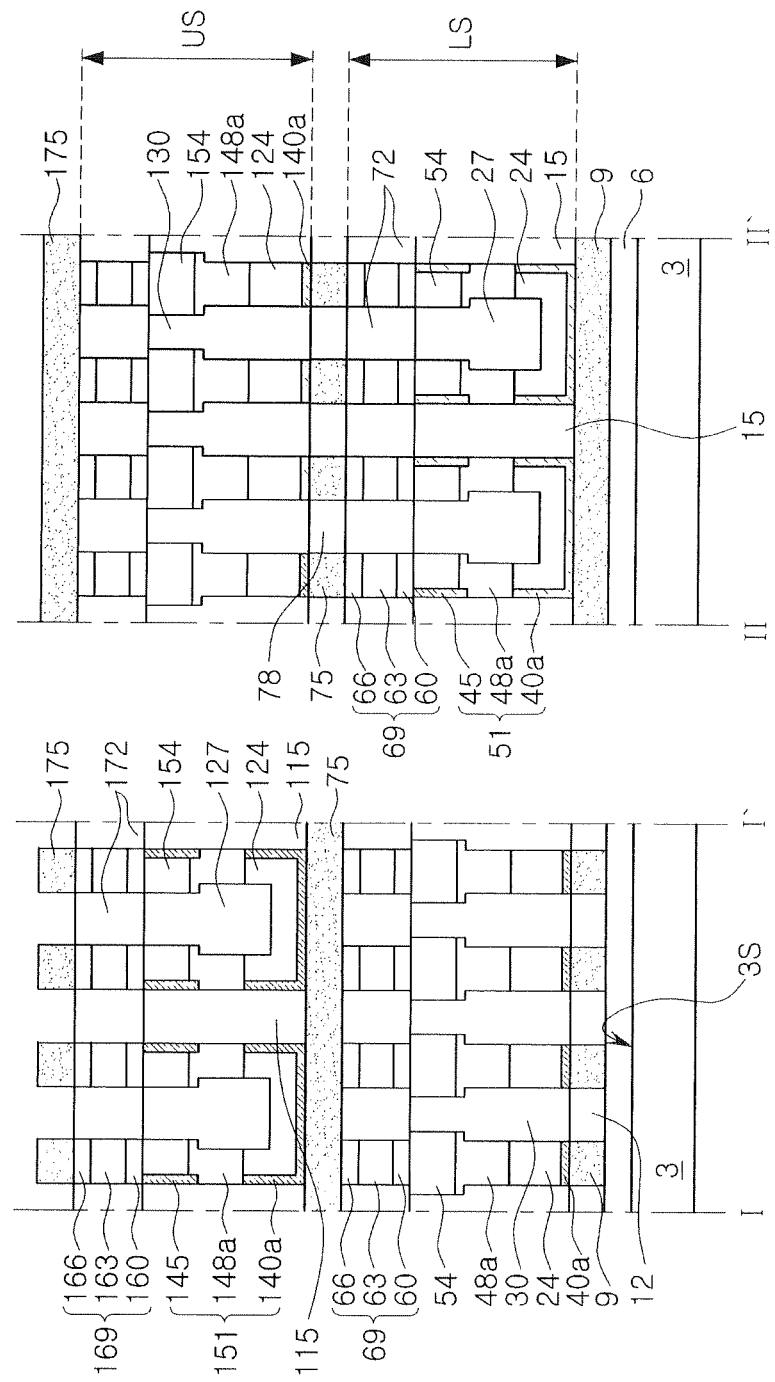
FIG. 4A is a cross-sectional view illustrating a modified example of a semiconductor device according to an example embodiment of the present inventive concept.
Figure 4B:
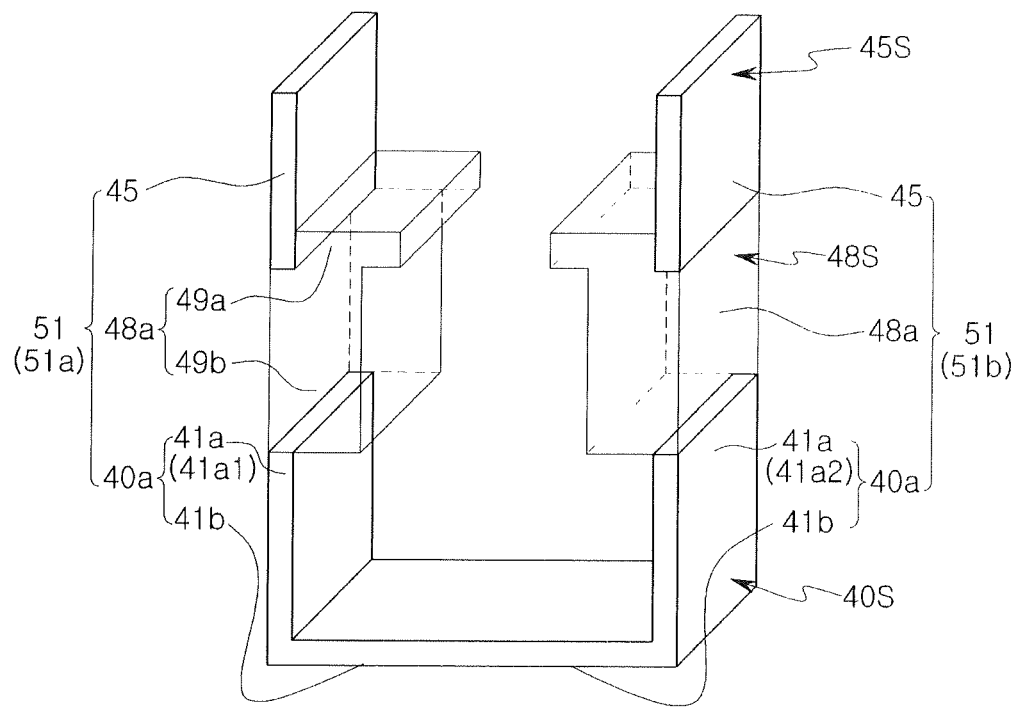
FIG. 4B is a perspective view illustrating a portion of components illustrated in FIG. 4A.
Figure 4B:
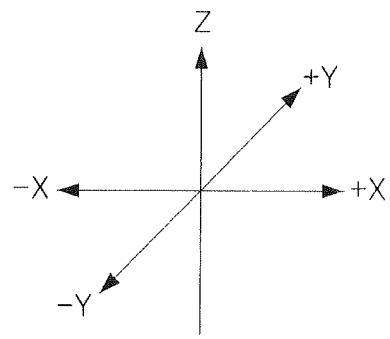

Next, another example of the semiconductor device 1 according to the example embodiment of the present inventive concept will be described with reference to FIGS. 3A and 3B and FIGS. 4A and 4B. FIGS. 3A and 3B are plan views illustrating a modified example of the semiconductor device 1 according to the example embodiment of the present inventive concept. FIG. 4A is a cross-sectional view illustrating regions taken along lines I-I' and II-IF of FIGS. 3A and 3B in order to describe the modified example of the semiconductor device 1 according to the example embodiment of the present inventive concept, and FIG. 4B is a perspective view of a portion of components illustrated in FIG. 4A. Meanwhile, hereinafter, it is understood that data storage patterns may include the same the first and second data storage regions DRa and DRb described with reference to in FIGS. 1 and 2, even when the first and second data storage regions DRa and DRb are not described separately.

Referring to FIGS. 3A and 3B and FIGS. 4A and 4B, a plurality of first conductive lines 9 may be arranged on a base insulating layer 6 disposed on a substrate 3. First gap-fill patterns 12 filling spaces between the plurality of first conductive lines 9. The first gap-fill patterns 12 may be formed of silicon oxide. A first memory region LS may be formed on the plurality of first conductive lines 9 and the first gap-fill patterns 12.

The first memory region LS may include a plurality of first data storage structures 51, a plurality of first selector structures 69, interlayer insulating patterns 72, first insulating patterns 15, second insulating patterns 27, third insulating patterns 30, spacer patterns 24, and capping patterns 54.

The first insulating patterns 15 may be disposed on the plurality of first conductive lines 9 to be spaced apart from each other. The third insulating patterns 30 may be disposed on the first gap-fill patterns 12 to be spaced apart from each other. The plurality of first data storage structures 51 may be disposed between the first insulating patterns 15, and between the third insulating patterns 30. The plurality of first selector structures 69 may be surrounded by the interlayer insulating patterns 72.

The plurality of first data storage structures 51 may include a plurality of first lower data storage electrodes 40a and a plurality of first upper data storage electrodes 45, the same as those described with reference to FIG. 2. In addition, the plurality of first data storage structures 51 may include a plurality of first data storage patterns 48a in contact with the plurality of first lower data storage electrodes 40a and the plurality of first upper data storage electrodes 45.

Each of the plurality of first lower data storage electrodes 40a may include the same first portion 41a and second portion 41b as those described with reference to FIG. 2. Accordingly, as described with reference to FIG. 2, the second portion 41b may connect the bottoms of the pair of first portions 41a1 and 41a2, adjacent to and facing each other. Accordingly, in the plurality of first lower data storage electrodes 40, the pair of first portions 41a1 and 41a2 facing each other may share one second portion 41b.

The spacer patterns 24 may be disposed on the second portions 41b of the plurality of first lower data storage electrodes 40a. The spacer patterns 24 may be disposed below the plurality of first data storage patterns 48a to cover bottom surfaces and portions of side surfaces of the second insulating patterns 27. The spacer patterns 24 may be conformally formed to have a greater thickness than the first lower data storage electrodes 40a, and may have a "U" shape whose center portion is recessed. The second insulating patterns 27 may fill the recessed portion of the spacer patterns 24 and extend in the direction Z perpendicular to the surface 3S of the substrate 3.

The first to third insulating patterns 15, 27, and 30 may be formed of a material having etch selectivity with respect to the spacer patterns 24. For example, the first to third insulating patterns 15, 27, and 30 may be formed of a silicon nitride, and the spacer patterns 24 may be formed of a silicon oxide.

The capping patterns 54 may be disposed on the plurality of first data storage patterns 48a. The capping patterns 54 may be disposed between upper side surfaces of the second insulating patterns 27 and the first upper data storage electrodes 45. The capping patterns 54 may be formed of an insulating material such as a silicon oxide or a silicon nitride.

In some example embodiments, the bottom surfaces of the plurality of first data storage patterns 48a may be in contact with the first lower data storage electrodes 40a and the spacer patterns 24, and top surfaces of the plurality of first data storage patterns 48a may be in contact with the first upper data storage electrodes 45 and the capping patterns 54.

In some example embodiments, in one of the plurality of first data storage patterns 48a, an area of the first data storage pattern 48a in contact with a neighboring first lower data storage electrode 40a may be smaller than an area of the first data storage pattern 48a in contact with a neighboring spacer pattern 24. Likewise, in one of the plurality of first data storage patterns 48a, an area of the first data storage pattern 48a in contact with a neighboring first upper data storage electrode 45 may be smaller than an area of the first data storage pattern 48a in contact with a neighboring capping pattern 54.

In some example embodiments, the plurality of first data storage patterns 48a may be in contact with bottom surfaces the first upper data storage electrodes 45 and may extend to partially cover side surfaces of the first upper data storage electrodes 45. Each of the plurality of first data storage patterns 48a may include a first portion 49a and a second portion 49b. In the plurality of first data storage patterns 48a, the first portions 49a may cover the side surface of the first upper data storage electrodes 45, and the second portions 49b may be in contact with the bottom surfaces of the first upper data storage electrodes 45 and disposed at a lower level than the first upper data storage electrodes 45. The plurality of first data storage patterns 48a may be in contact with the first portions 41a of the first lower data storage electrodes 40a and may extend in a positive direction +X or a negative direction −X of the first direction X to overlap the second portion 41b of the first lower data storage electrodes 40a. For example, one of the pair of first data storage patterns 48a in contact with a pair of first portions 41a1 and 41a2 sharing a second portion 41b in one of the first lower data storage electrodes 40a may be in contact with one first portion 41a1 to extend in the positive direction +X of the first direction X, and the other of the first data storage pattern 48a may be in contact with the other first portion 41a2 to extend in the negative direction −X of the first direction X. Side surfaces of the plurality of first data storage patterns 48a overlapping the second portions 41b of the first lower data storage electrodes 40a may be stepped.

A plurality of second conductive lines 75 may be arranged on the first memory region LS. Second gap-fill patterns 78 may be disposed between the plurality of second conductive lines 75.

A second memory region US may be disposed on the plurality of second conductive lines 75 and the second gap-fill patterns 78. The second memory region US may be formed by rotating the first memory region LS 90 degrees in the direction parallel to the surface 3S of the substrate 3. Accordingly, since the second memory region US is formed by rotating the first memory region LS 90 degrees, the second memory region US may include components, rotated 90 degrees in one-to-one correspondence with the components of the first memory region LS. For example, the second memory region US may include a plurality of second data storage structures 151, a plurality of second selector structures 169, interlayer insulating patterns 172, first insulating patterns 115, second insulating patterns 127, third insulating patterns 130, spacer patterns 124, and capping patterns 154, rotated 90 degrees in one-to-one correspondence with the plurality of first data storage structures 51, the plurality of first selector structures 69, the interlayer insulating patterns 72, the first insulating patterns 15, the second insulating patterns 27, the third insulating patterns 30, the spacer patterns 24, and the capping patterns 54 of the first memory region LS.

Figure 5:
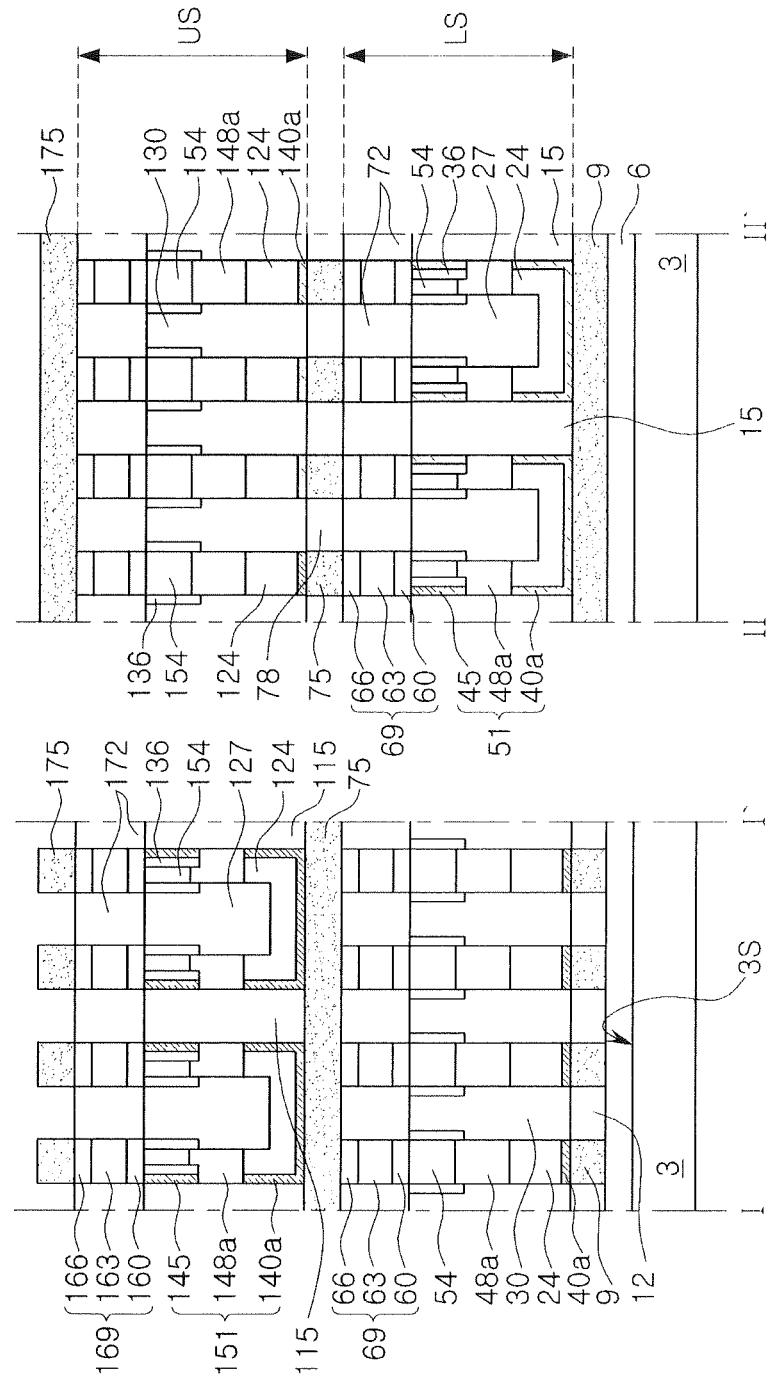
FIG. 5 is a cross-sectional view illustrating another example of a semiconductor device according to an example embodiment of the present inventive concept.

In some example embodiments, the capping patterns 54 may be in contact with the first upper data storage electrodes 45, the second insulating patterns 27, and the third insulating patterns 30. However, the present inventive concept is not limited thereto. For example, the capping patterns 54 may be spaced apart from the first upper data storage electrodes 45, the second insulating patterns 27, and the third insulating patterns 30. Such capping patterns 54, spaced apart from the first upper data storage electrodes 45, the second insulating patterns 27, and the third insulating patterns 30, will be described with reference to FIG. 5. While describing another example of the semiconductor device 1 according to the example embodiment of the present inventive concept with reference to FIG. 5, the capping patterns 54 described with reference to FIG. 4A will be mainly described. Components not specifically described with reference to FIG. 5 may be understood as being the same components as those described with reference to FIG. 4A. Accordingly, even though separated explanations are not provided with reference to FIG. 5, the components described in FIG. 4A will be referenced together. FIG. 5 is a cross-sectional view illustrating the modified example of the semiconductor device 1 according to the example embodiment of the present inventive concept. FIG. 5 illustrates regions taken along lines I-I' and II-II" of FIGS. 3A and 3B.

Referring to FIG. 5, the first memory region LS may include first upper spacers 36 surrounding side surfaces of the capping patterns 54 and isolating the capping patterns 54 from the first upper data storage electrodes 45, the second insulating patterns 27, and the third insulating patterns 30. The first upper spacers 36 may be formed of an insulating material such as silicon oxide or silicon nitride. The second memory region US may include second upper spacers 136 corresponding to the first upper spacers 136 of the first memory region LS. The first and second upper spacers 36 and 136 may function to form contact areas between the first and second upper data storage electrodes 45 and 145 and the first and second data storage patterns 48a and 148a. Accordingly, scattering of cell characteristics of the phase change memory device may be reduced.

Figure 6:
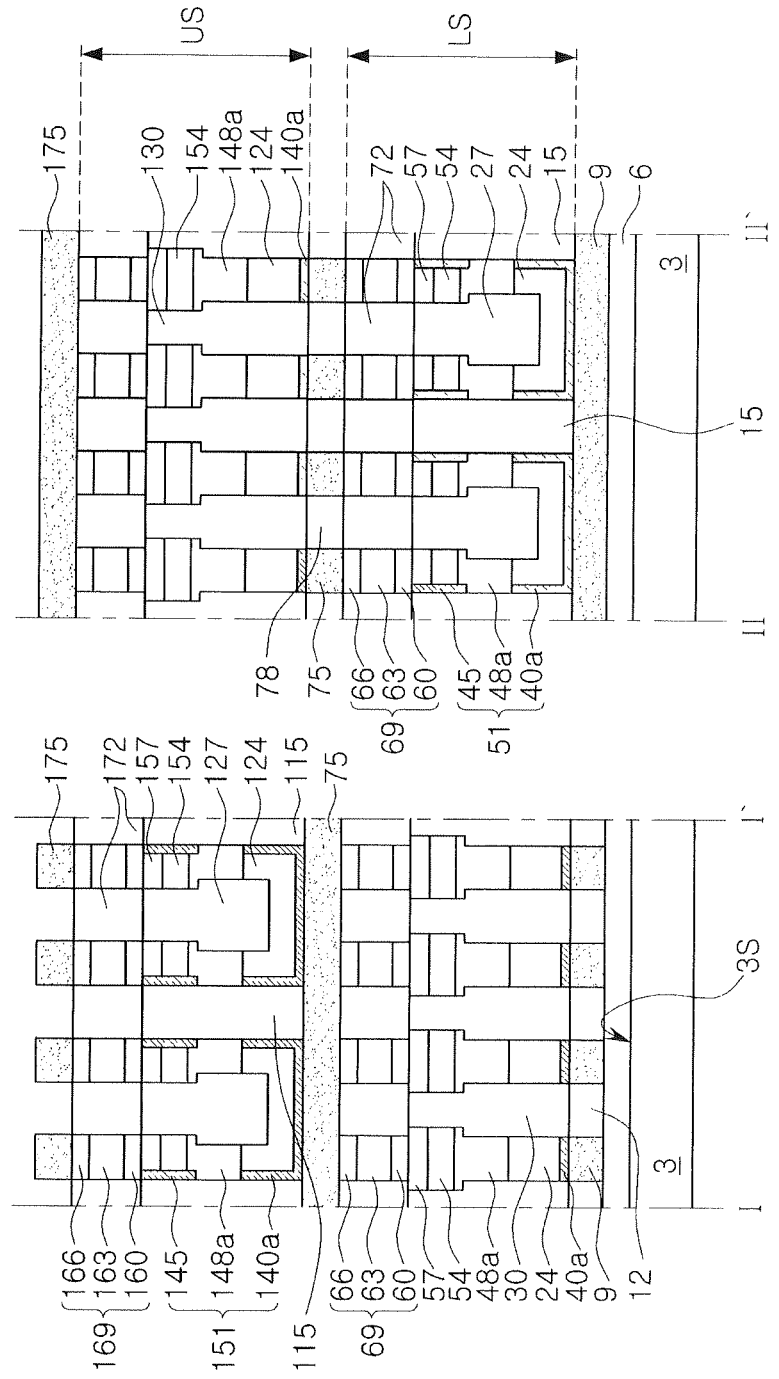
FIG. 6 is a cross-sectional view illustrating another example of a semiconductor device according to an example embodiment of the present inventive concept.

Referring again to FIGS. 3A and 3B and FIGS. 4A and 4B, the first lower selector electrodes 60 of the first selector structures 69 may be in contact with the first upper data storage electrodes 45 and the capping patterns 54. However, the present inventive concept is not limited thereto. For example, the first lower selector electrodes 60 of the first selector structures 69 may be in contact with the first upper data storage electrodes 45 and spaced apart from the capping patterns 54. Such a modified example will be described with reference to FIG. 6. FIG. 6 is a cross-sectional view illustrating another example of the semiconductor device 1 according to the example embodiment of the present inventive concept. FIG. 6 is a cross-sectional view illustrating regions taken along lines I-I' and II-IF of FIGS. 3A and 3B.

Referring to FIG. 6, the first memory region LS may include first conductive patterns 57 interposed between the first lower selector electrodes 60 and the capping patterns 54 to separate the first lower selector electrodes 60 from the capping patterns 54. The first conductive patterns 57 may be in contact with upper side surfaces of the first upper data storage electrodes 45 and bottom surfaces of the first lower selector electrodes 60. Accordingly, since the first conductive patterns 57 decrease the electrical resistance between the first data storage structures 51 and the first selector structures 69, electrically connected, electrical characteristics of the semiconductor device may be improved. Like the first memory region LS, the second memory region US may include second conductive patterns 157 corresponding to the first conductive patterns 57 of the first memory region LS. The first and second conductive patterns 57 and 157 may be formed of a metal such as tungsten and/or a metal nitride such as TiN.

Figure 7A:
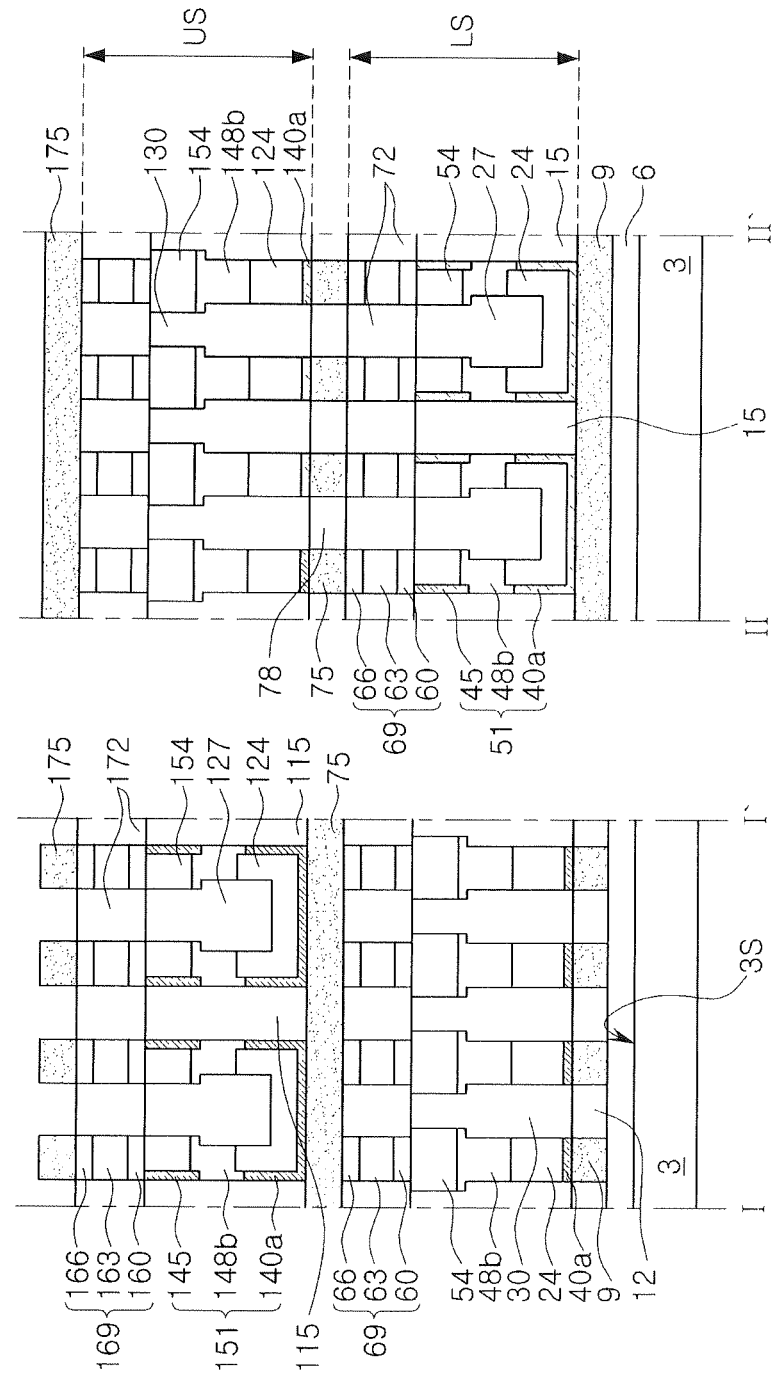
FIG. 7A is a cross-sectional view illustrating another example of a semiconductor device according to an example embodiment of the present inventive concept.

Referring again to FIGS. 3A and 3B and FIGS. 4A and 4B, the first lower data storage electrodes 40a may have top surfaces coplanar with top surfaces of the spacer patterns 24. However, the present inventive concept is not limited thereto. For example, the top surfaces of the first lower data storage electrodes 40a may be disposed at a lower level than the top surfaces of the spacer patterns 24. A semiconductor device including the first lower data storage electrodes 40a having the tope surfaces disposed at the lower level than the top surfaces of the spacer patterns 24, and modified first data storage patterns in contact with the first lower data storage electrodes 40a, will be described with reference to FIGS. 7A and 7B. FIG. 7A is a cross-sectional view illustrating regions taken along lines I-I' and II-IF of FIGS. 3A and 3B in order to describe another example of the semiconductor device 1 according to the example embodiment of the present inventive concept, and FIG. 7B is a perspective view of a portion of components illustrated in FIG. 7A.

Figure 7B:
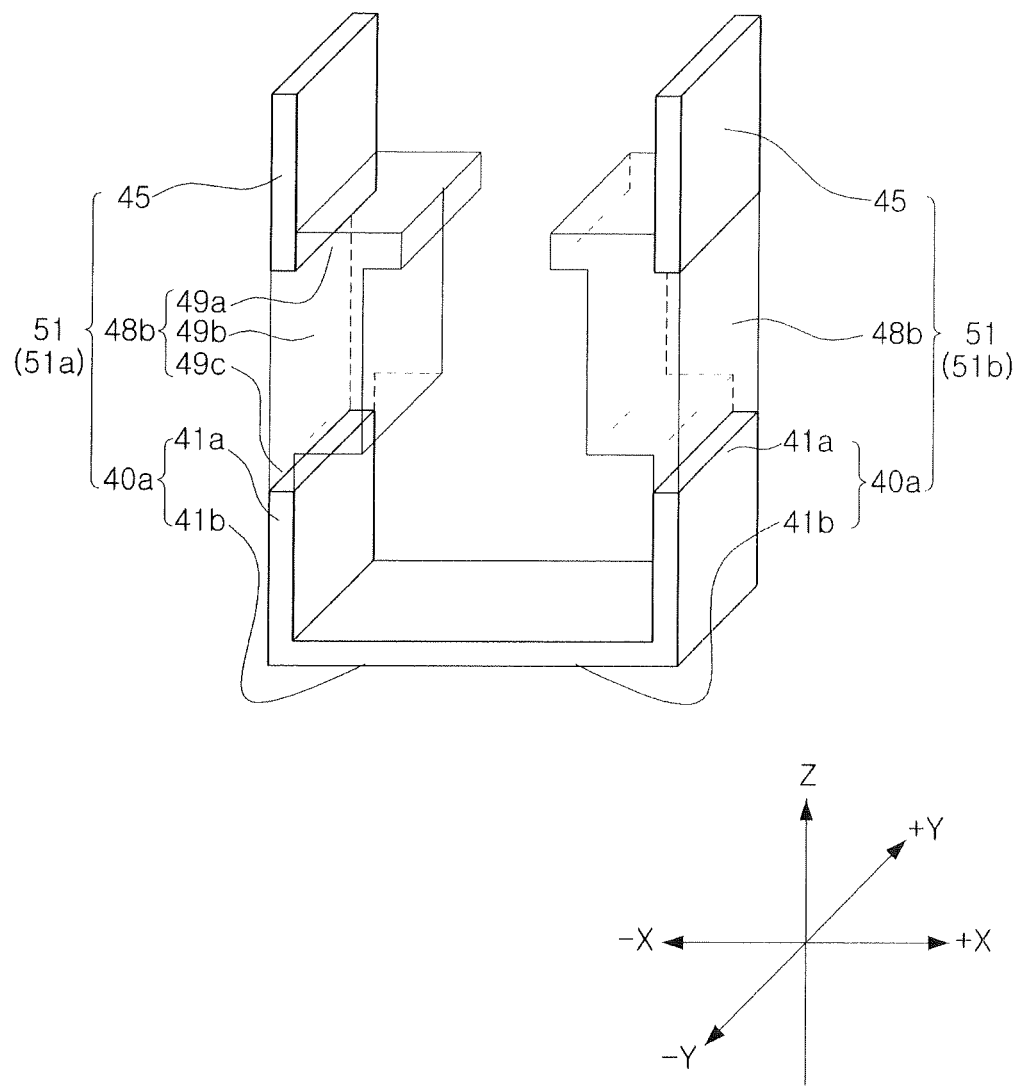
FIG. 7B is a perspective view illustrating a portion of components illustrated in FIG. 7A.

Referring to FIGS. 7A and 7B, the first memory region LS may include first lower data storage electrodes 40a having top surfaces disposed at a lower level than top surfaces of the spacer patterns 24, and first data storage patterns 48b having areas 49c in contact with the first lower data storage electrodes 40a.

The first data storage patterns 48b may include third portions 49c extending downwardly from portions of the second portions 49b and in contact with the first lower data storage electrodes 40a, in addition to the first portions 49a and the second portions 49b, the same as those described with reference to FIGS. 3A and 3B and FIGS. 4A and 4B. In the first data storage patterns 48b, each of the third portions 49c may have a smaller width than the first portions 49a and the second portions 49b. The third portions 49c of the first data storage patterns 48b may be interposed between the spacer patterns 24 and the first insulating patterns 15.

The second memory region US may include second lower data storage electrodes 140a, spacer patterns 124, and second data storage patterns 148b respectively corresponding to the first lower data storage electrodes 40a, the spacer patterns 24, and the first data storage patterns 48b in the first memory region LS and rotated 90 degrees.

Figure 8A:
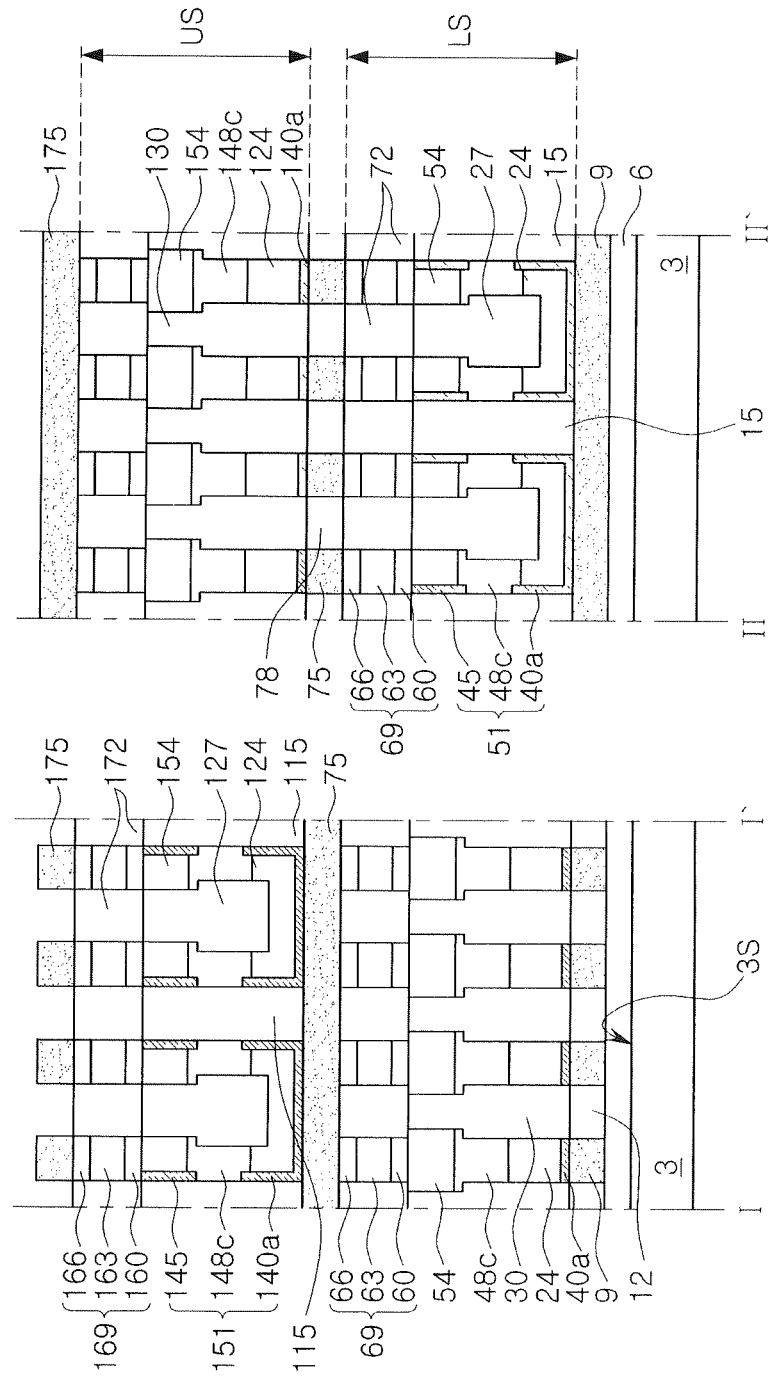
FIG. 8A is a cross-sectional view illustrating another example of a semiconductor device according to an example embodiment of the present inventive concept.

Referring again to FIGS. 3A and 3B and FIGS. 4A and 4B, the first lower data storage electrodes 40a may have the top surfaces coplanar with the top surfaces of the spacer patterns, but the present inventive concept is not limited thereto. For example, the spacer patterns 24 may have top surfaces disposed at a lower level than the top surfaces of the first lower data storage electrodes 40a. An example of a semiconductor device including the spacer patterns 24 having the top surfaces disposed at a lower level than the top surfaces of the first lower data storage electrodes 40a, and modified first data storage patterns in contact with the first lower data storage electrodes 40a and the spacer patterns 24, will be described with reference to FIGS. 8A and 8B. FIG. 8A is a cross-sectional view illustrating regions taken along lines I-I' and II-IF of FIGS. 3A and 3B in order to describe another example of the semiconductor device 1 according to the example embodiment of the present inventive concept, and FIG. 8B is a perspective view of a portion of components illustrated in FIG. 8A.

Figure 8B:
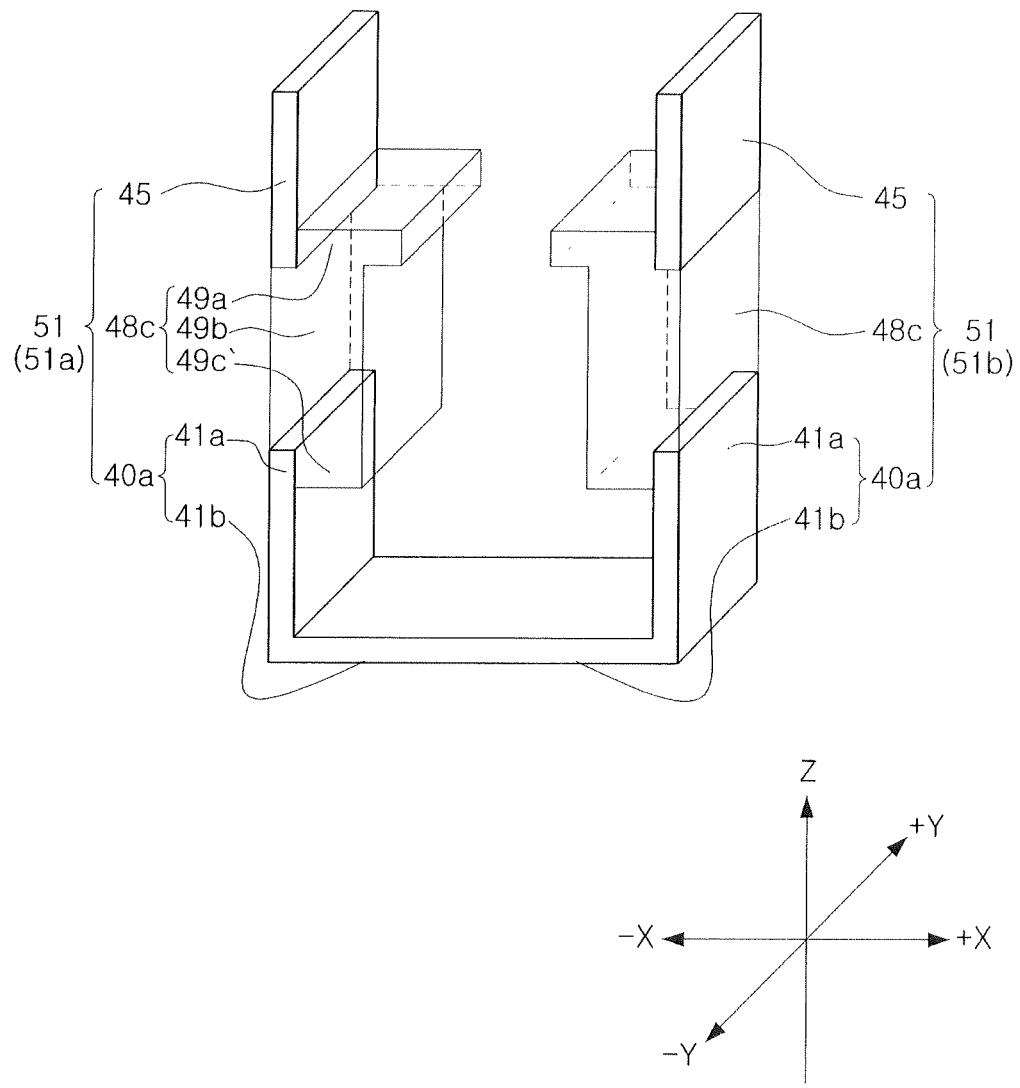
FIG. 8B is a perspective view illustrating a portion of components illustrated in FIG. 8A.

Referring to FIGS. 8A and 8B, the first memory region LS may include spacer patterns 24 having top surfaces disposed at a lower level than the top surfaces of the first lower data storage electrodes 40a, and first data storage patterns 48c having a areas 49c' in contact with the first lower data storage electrodes 40a and the spacer patterns 24.

The first data storage patterns 48c may include the same as the first portions 49a and the second portions 49b described with reference to FIGS. 3A and 3B and FIGS. 4A and 4B, and the third areas 49c' extending downwardly from portions of the second portions 49b and in contact with side surfaces of the first lower data storage electrodes 40a and top surfaces of the spacer patterns 24. The third areas 49c' of the first data storage patterns 48c may be interposed between the first lower data storage electrodes 40a and the first insulating patterns 15.

The second memory region US may include second lower data storage electrodes 140a, spacer patterns 124, and second data storage patterns 148c respectively corresponding to the first lower data storage electrodes 40a, the spacer patterns 24, and the first data storage patterns 48c in the first memory region LS and rotated 90 degrees.

Figure 9A:
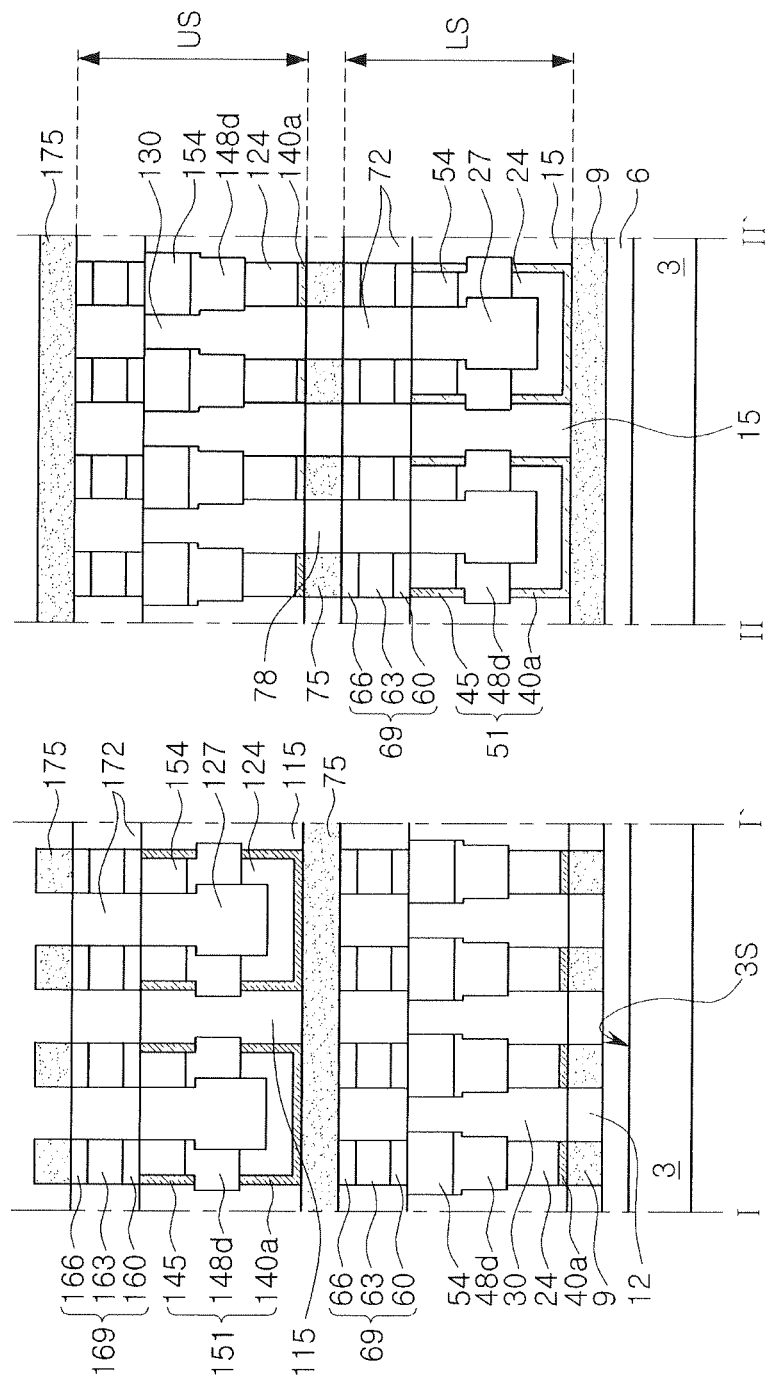
FIG. 9A is a cross-sectional view illustrating another example of a semiconductor device according to an example embodiment of the present inventive concept.

Referring again to FIGS. 3A and 3B and FIGS. 4A and 4B, the first lower data storage electrodes 40a, the first data storage patterns 48a, and the first upper data storage electrodes 45 may have vertically-aligned side surfaces 40S, 48S, and 45S. However, the present inventive concept is not limited thereto. For example, a semiconductor device including first data storage patterns whose side surfaces are not vertically aligned with side surfaces of the first lower data storage electrodes 40a and the first upper data storage electrodes 45 will be described with reference to FIGS. 9A and 9B. FIG. 9A is a cross-sectional view illustrating regions taken along lines I-I' and II-IF of FIGS. 3A and 3B in order to describe another example of the semiconductor device 1 according to the example embodiment of the present inventive concept, and FIG. 9B is a perspective view of a portion of components illustrated in FIG. 9A.

Figure 9B:
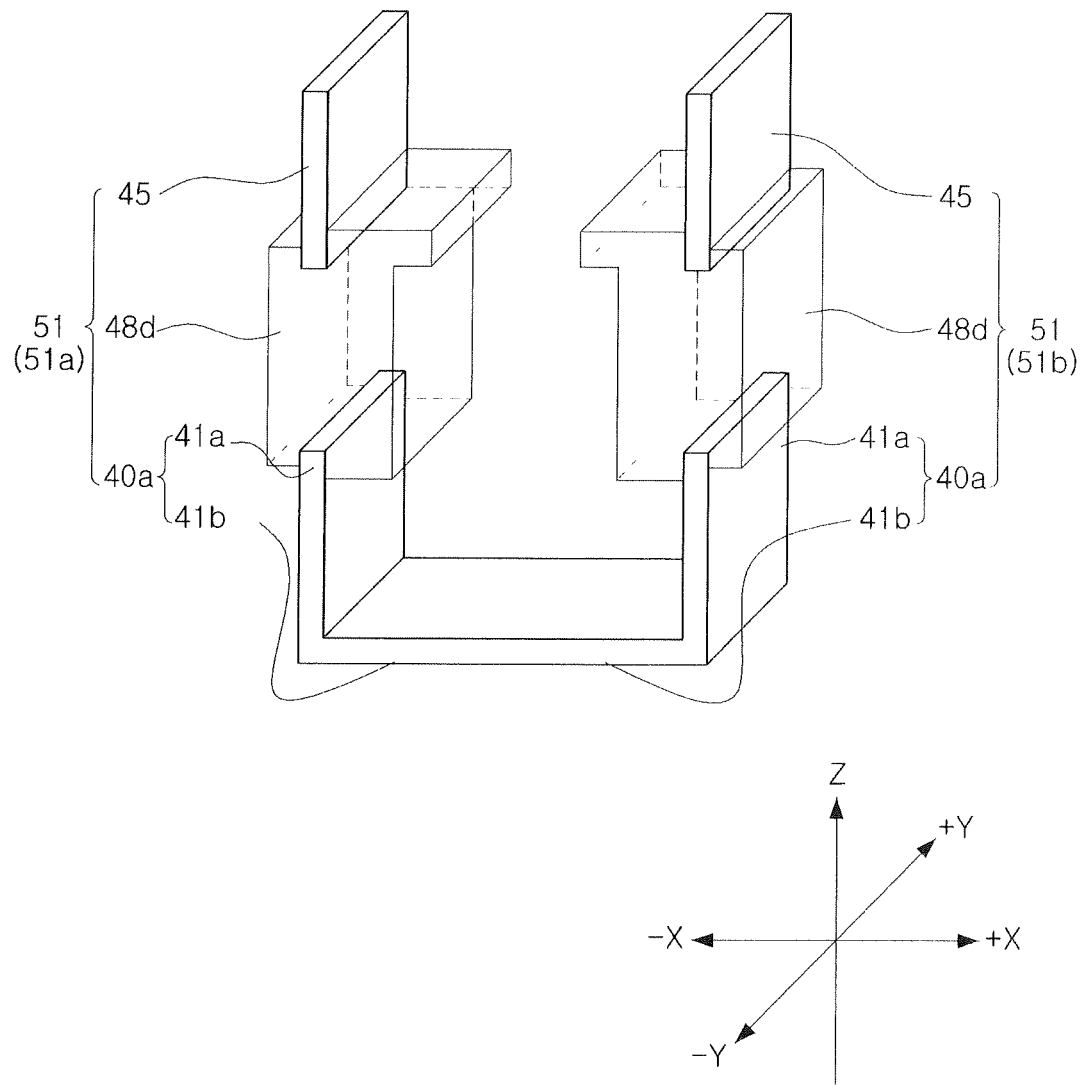
FIG. 9B is a perspective view illustrating a portion of components illustrated in FIG. 9A.

Referring to FIGS. 9A and 9B, the first memory region LS may include first data storage patterns 48d whose side surfaces are not vertically aligned with the side surfaces of the first lower data storage electrodes 40a and the first upper data storage electrodes 45. The first lower data storage electrodes 40a and the first upper data storage electrodes 45 may have vertically-aligned side surfaces.

The first data storage patterns 48d may be in contact with and cover top surfaces of the first lower data storage electrodes 40a and upper side surfaces of the first lower data storage electrodes 40a. In addition, the first data storage patterns 48d may be in contact with and cover bottom surfaces of the first upper data storage electrodes 45 and lower side surfaces of the first upper data storage electrodes 45. Accordingly, the side surfaces of the first data storage patterns 48d may not be vertically aligned with the side surfaces of the first lower data storage electrodes 40a and the first upper data storage electrodes 45.

The second memory region US may include second lower data storage electrodes 140a, spacer patterns 124, and the second data storage patterns 148d respectively corresponding to the first lower data storage electrodes 40a, the spacer patterns 24, and the first data storage patterns 48d and rotated 90 degrees.

Figure 10:
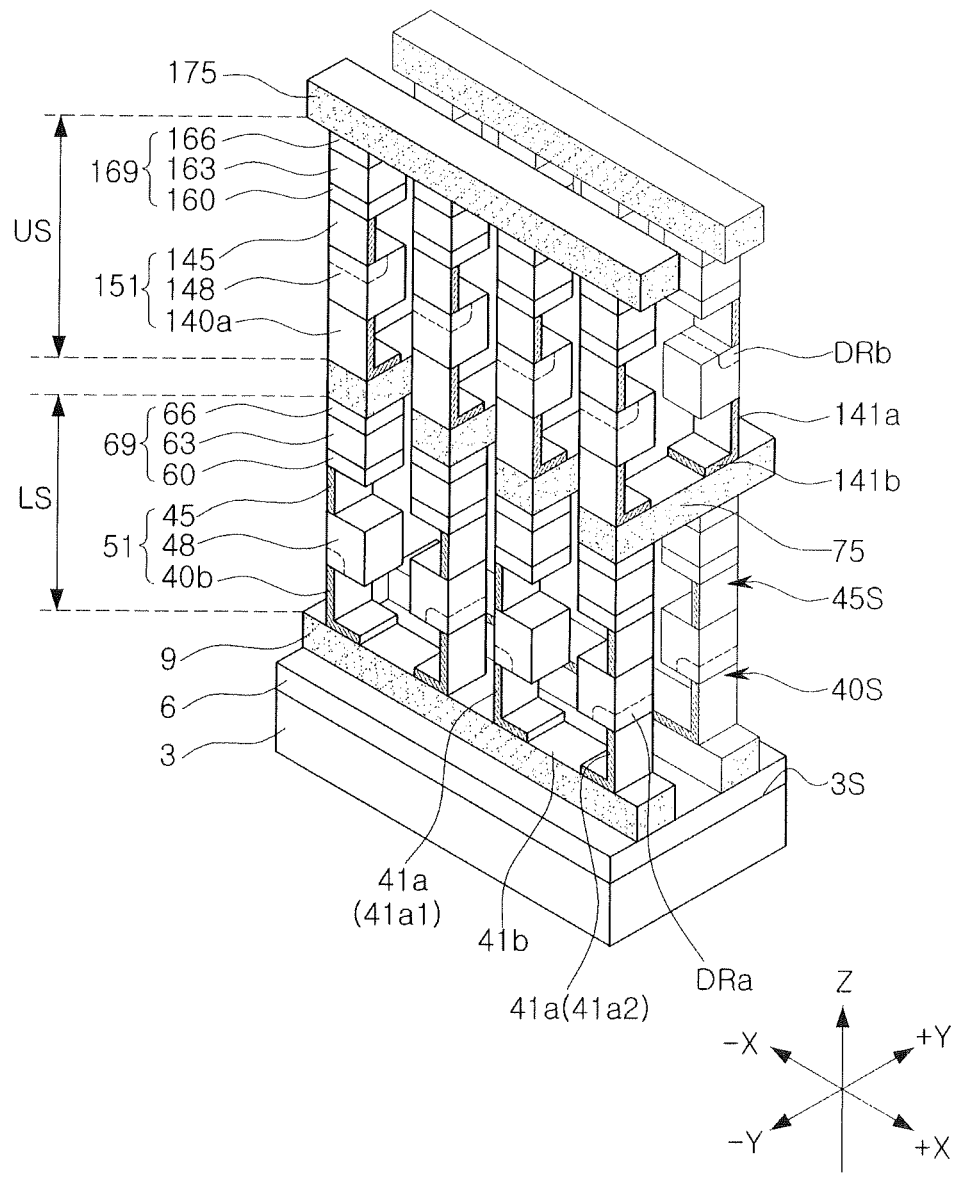
FIG. 10 is a perspective view illustrating another example of a semiconductor device according to an example embodiment of the present inventive concept.

As described above with reference to FIG. 2, among the first lower data storage electrodes 40a, one pair of lower data storage electrodes 40a disposed on one first conductive line 9 and facing each other may include a pair of first portions 41a1 and 41a2 facing each other and a second portion 41b shared by the pair of first portions 41a1 and 41a2. However, the present inventive concept is not limited thereto. For example, among the first lower data storage electrodes 40a, one pair of first lower data storage electrodes disposed on one first conductive line 9 and facing each other may include a pair of first portions 41a1 and 41a2 facing each other and second portions extending from bottoms of the pair of first portions 41a1 and 41a2 to face each other and to be spaced apart from each other. An example embodiment of a semiconductor device including the first lower data storage electrodes having the second portions spaced apart each other, will be described with reference to FIG. 10. FIG. 10 is a perspective view illustrating another example of the semiconductor device 1 according to the example embodiment of the present inventive concept.

Referring to FIG. 10, the first memory region LS may include first lower data storage electrodes 40b having a pair of first portions 41a1 and 41a2 facing each other and second portions 41b extending from bottoms of the pair of first portions 41a1 and 41a2 to face each other and to be spaced apart from each other. The second memory region US may include second lower data storage electrodes 140b corresponding to the first lower data storage electrodes 40b of the first memory region LS and rotated 90 degrees.

Figure 11A:
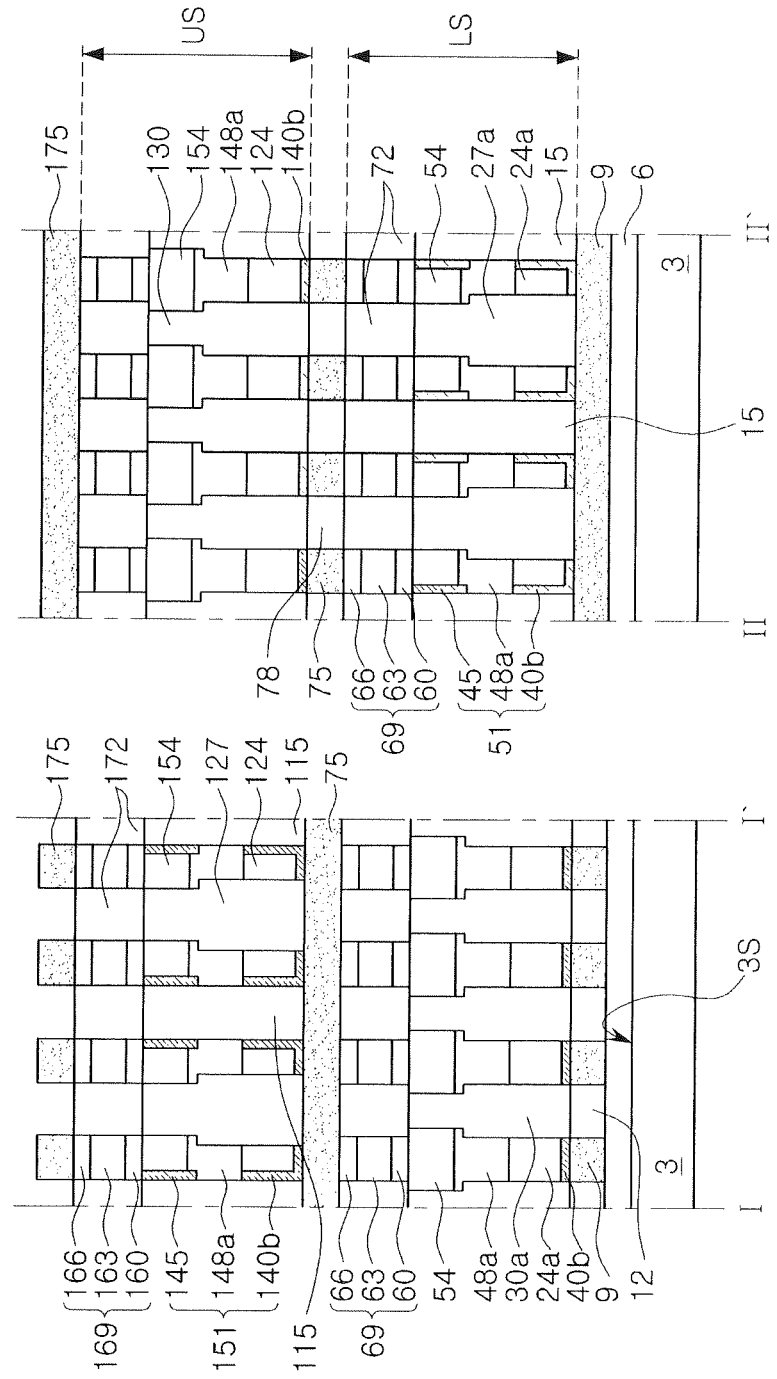
FIG. 11A is a cross-sectional view illustrating another example of a semiconductor device according to an example embodiment of the present inventive concept.
Figure 11B:
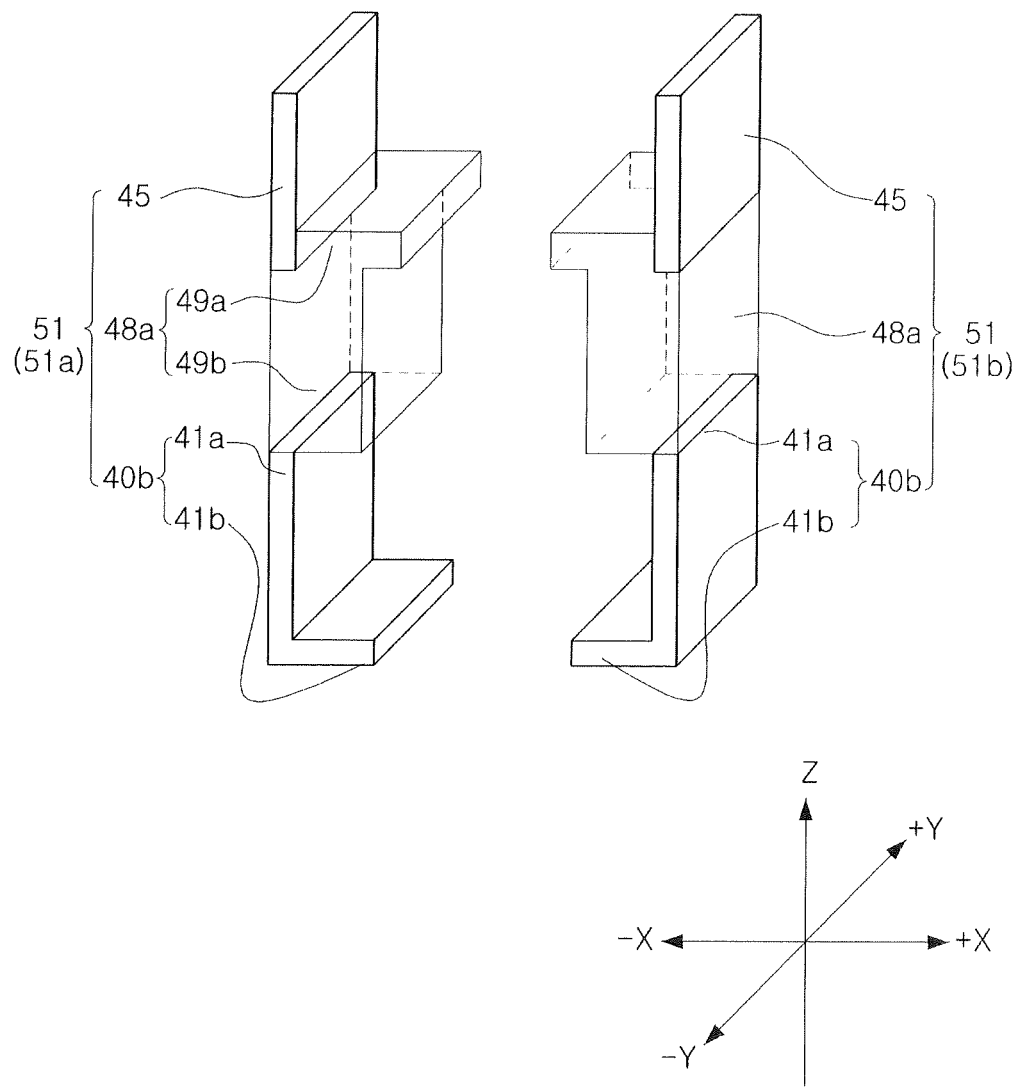
FIG. 11B is a perspective view illustrating a portion of components illustrated in FIG. 11A.

An example of the semiconductor device including the first lower data storage electrodes 140a and the second lower data storage electrodes 140b will be described with reference to FIGS. 11A and 11B. FIG. 11A is a cross-sectional view illustrating regions taken along lines I-I' and II-IF of FIGS. 3A and 3B in order to describe another example of the semiconductor device 1 according to the example embodiment of the present inventive concept, and FIG. 11B is a perspective view of a portion of components illustrated in FIG. 11A. In FIGS. 11A and 11B, components modified from the semiconductor device described with reference to FIGS. 4A and 4B will be mainly described.

Referring to FIGS. 11A and 11B, the first memory region LS may include the first lower data storage electrodes 40b described with reference to FIG. 10. The first memory region LS may include spacer patterns 24a interposed between the first data storage patterns 48a and the second portions 41b of the first lower data storage electrodes 40b, and second insulating patterns 27a interposed between the second portions 41b of the first lower data storage electrodes 40b and extending in a direction perpendicular to the surface of the substrate 3.

Figure 12:
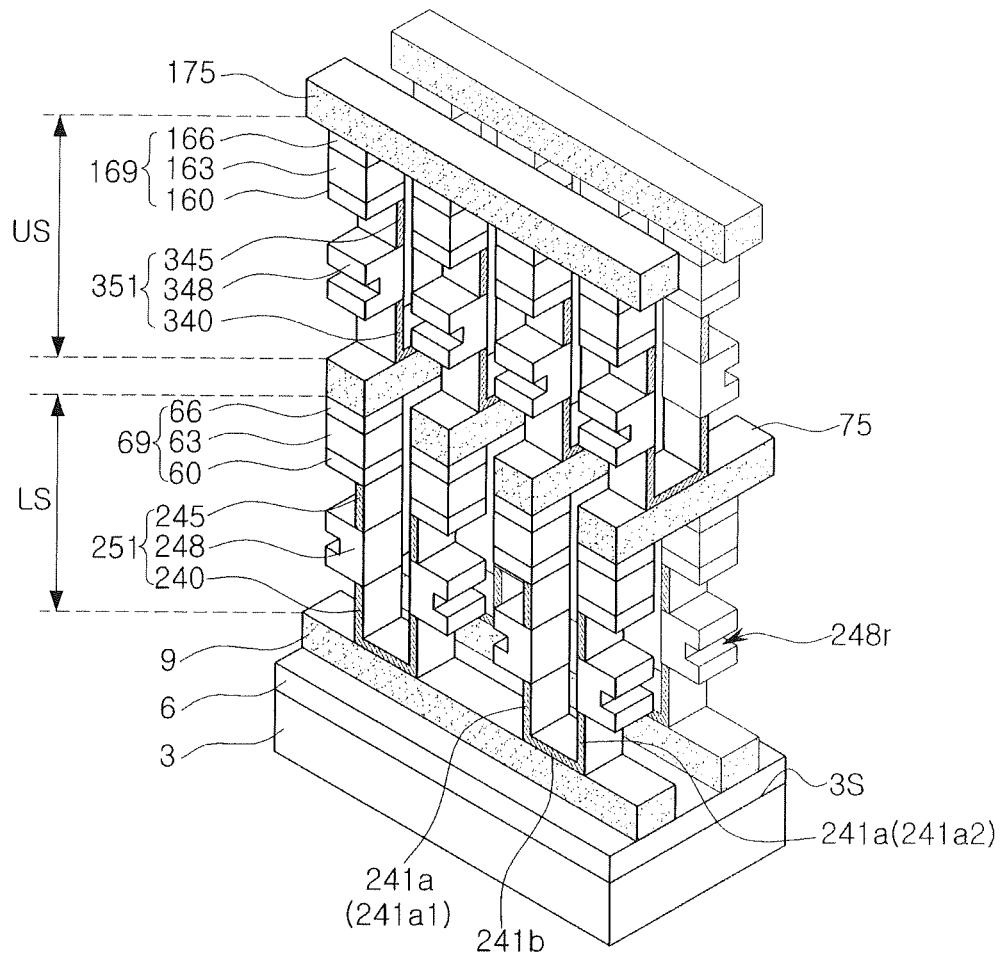
FIG. 12 is a perspective view illustrating another example of a semiconductor device according to an example embodiment of the present inventive concept.

Next, another example of the semiconductor device 1 according to the example embodiment of the present inventive concept will be described with reference to FIG. 12. FIG. 12 is a schematic perspective view illustrating the modified example of the semiconductor device 1 according to the example embodiment of the present inventive concept.

Referring to FIG. 12, like those described with reference to FIG. 2, the plurality of first conductive lines 9, the plurality of second conductive lines 75, and the plurality of third conductive lines 175 may be arranged on the base insulating layer 6 disposed on the substrate 3. The first memory region LS may be disposed between the first and second conductive lines 9 and 75, and the second memory region US may be disposed between the second and third conductive lines 75 and 75.

The first memory region LS may include a plurality of first data storage structures 251 and a plurality of first selector structures 69. Each of the plurality of first data storage structures 251 may be connected to each of the plurality of first selector structures 69 in series. Each of the plurality of first data storage structures 251 may include a first lower data storage electrode 240, a first data storage pattern 248, and a first upper data storage electrode 245, sequentially arranged in the direction Z perpendicular to the surface 3S of the substrate 3. The first lower data storage electrodes 240 may include first portions 241a perpendicular to the surface 3S of the substrate 3, and second portions 241b bottoms of the first portions 241a adjacent to each other and parallel to the surface 3S of the substrate 3. For example, the first lower data storage electrodes 240 may include a pair of first portions 241a1 and 241a2 adjacent to and facing each other and a second portion 241b connecting bottoms of the pair of first portions 241a1 and 241a2. The first portions 241a of the first lower data storage electrode 240 may have side surfaces vertically aligned with the first upper data storage electrodes 245.

Among the first data storage patterns 248, a pair of first data storage patterns 248 formed on the pair of first portions 241a1 and 241a2 may extend in a direction away from portions in contact with the pair of first portions 241a1 and 241a2. One of the first data storage patterns 248 formed on the pair of first portions 241a1 and 241a2 sharing the one second portion 241b may extend in the negative direction −X of the first direction X, and the other of the first data storage patterns 248 may extend in the positive direction +X of the first direction X.

Each of the first data storage patterns 248 may have a recessed area 248r in one of side surfaces thereof. For example, one of the pair of first data storage patterns 248 formed on the pair of first portions 241a1 and 241a2 sharing one second portion 241b may have "⊃" shape, and the other one may have a "⊂" shape. Accordingly, the pair of first data storage patterns 248 adjacent to each other may have vertical side surfaces facing each other or side surfaces having recessed center portions and facing each other, in one of the first direction X.

Each of the plurality of first selector structures 69 may include the first lower selector electrode 60, the first selector pattern 63 and the first upper selector electrode 66, the same as those described with reference to FIG. 2. The plurality of first selector structures 69 may overlap the first data storage patterns 251.

The second memory region US, like the second memory region US described with reference to FIG. 2, may be formed by rotating the first memory region LS by 90 degrees in the direction parallel to the surface 3S of the substrate 3. Accordingly, the second memory region US may include second data storage structures 351 and second selector structures 69 respectively corresponding to the first data storage structures 251 and the first selector structures 69 in the first memory region LS and rotated 90 degrees. In addition, each of the second data storage structures 351 may include a second lower data storage electrode 340, a second data storage pattern 348, and a second upper data storage electrode 345 respectively corresponding to the first lower data storage electrode 240, the first data storage pattern 248, and the first upper data storage electrode 245 and rotated 90 degrees. Each of the second selector structures 169 may include the second lower selector electrode 160, the second selector pattern 163, and the second upper selector electrode 166, the same as those described with reference to FIG. 2.

Figure 13A:
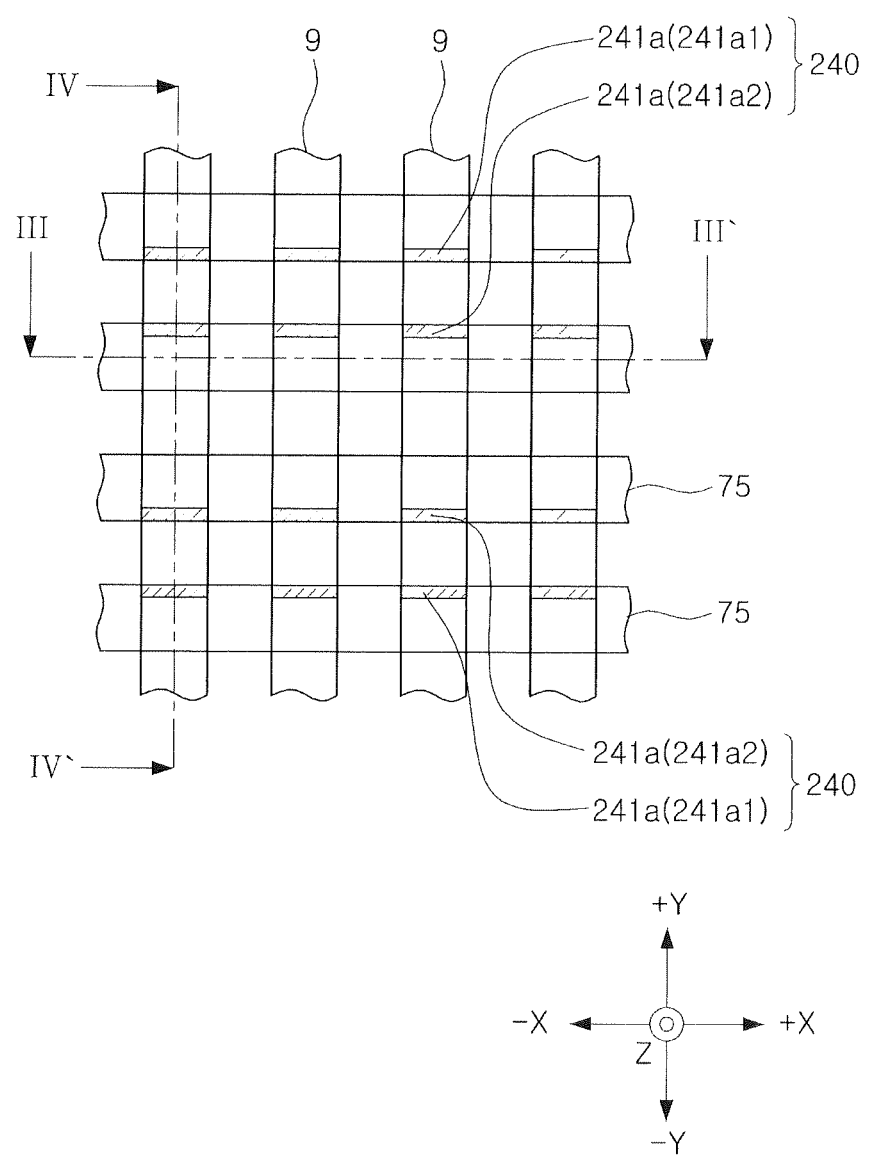
FIGS. 13A and 13B are plan views illustrating another example of a semiconductor device according to an example embodiment of the present inventive concept.
Figure 13B:
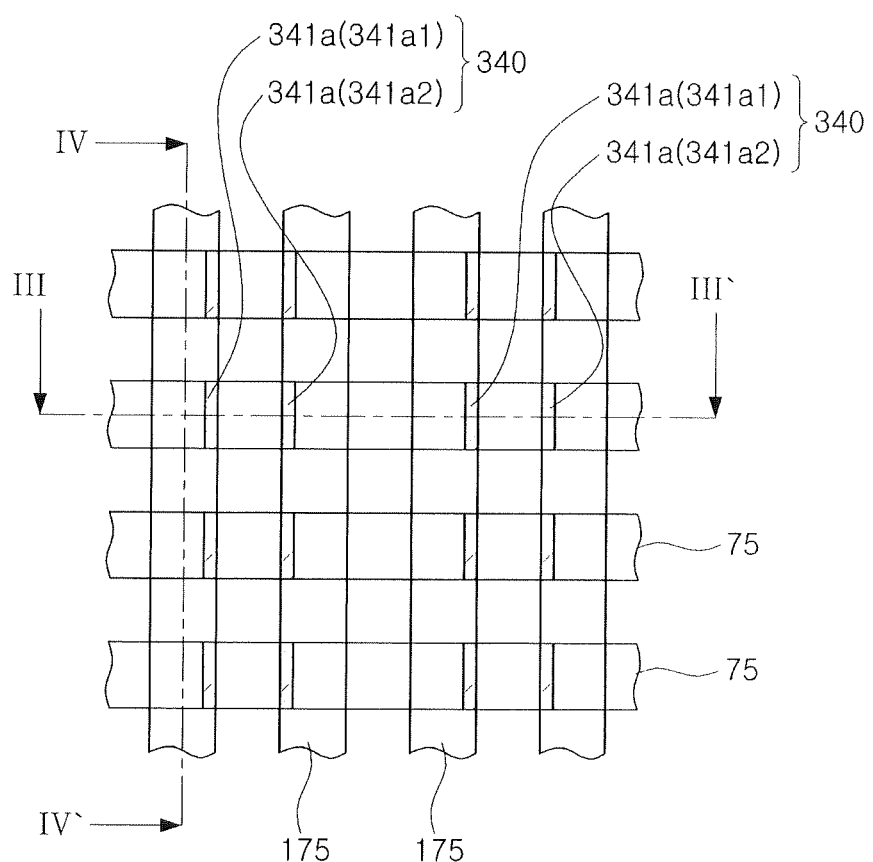
Figure 13B:
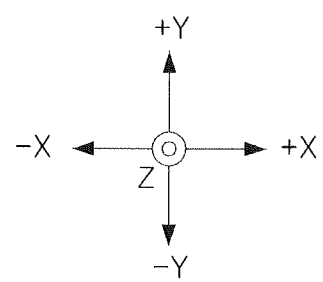

Next, another example of the semiconductor device 1 according to the example embodiment of the present inventive concept will be described with reference to FIGS. 13A, 13B, and 14. FIGS. 13A and 13B are plan views illustrating the modified example of the semiconductor device 1 according to the example embodiment of the present inventive concept, and FIG. 14 is a cross-sectional view illustrating regions taken along lines and IV-IV' of FIGS. 13A and 13B, in order to describe the modified example of the semiconductor device 1 according to an example embodiment of the present inventive concept.

Figure 14:
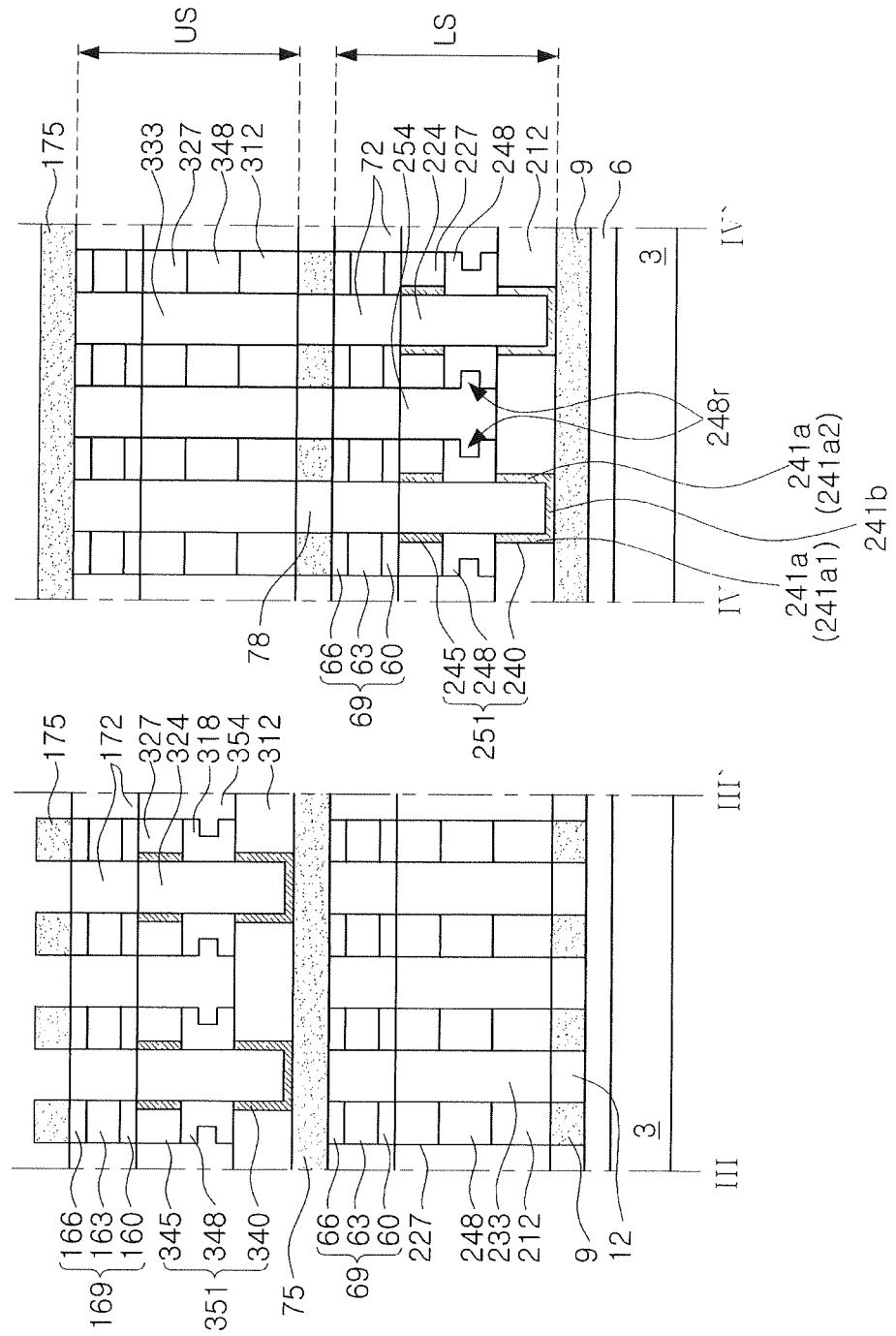
FIG. 14 is a cross-sectional view illustrating another example of a semiconductor device according to an example embodiment of the present inventive concept.

Referring to FIGS. 13A, 13B, and 14, similarly to FIG. 3A, the plurality of first conductive lines 9 may be arranged on the base insulating layer 6 disposed on the substrate 3, and first gap-fill patterns 12 filling spaces between the plurality of first conductive lines 9 may be arranged. A first memory region LS may be formed on the plurality of first conductive lines 9 and the first gap-fill patterns 12.

The first memory region LS may include a plurality of first data storage structures 251, a plurality of first selector structures 69, first insulating patterns 212, second insulating patterns 224, third insulating patterns 233, fourth insulating patterns 254, upper spacers 227, and interlayer insulating patterns 72.

Each of the plurality of first data storage structures 251 may include the first lower data storage electrode 240, the first data storage pattern 248, and the first upper data storage electrode 245, the same as those described with reference to FIG. 12. The plurality of first selector structures 69 may include the first lower selector electrode 60, the first selector pattern 63, and the first upper selector electrode 66, the same as those described with reference to FIG. 12. The plurality of first selector structures 69 may be surrounded by the interlayer insulating patterns 72.

The first lower data storage electrode 240 may include the first portions 241a1 and 241a2 and the second portions 241b, the same as those described with reference to FIG. 12.

The first insulating patterns 212 may be disposed on the first conductive lines 9 and interposed between the first lower data storage electrodes 240. The second insulating patterns 224 may be disposed on the second portions 241b of the first lower data storage electrodes 240 and extending upwardly to be interposed between the first data storage patterns 248 and between the first upper data storage electrodes 245. The upper spacers 227 may be disposed on the first data storage patterns 248. The third insulating patterns 233 may be disposed on the first gap-fill patterns 12. The fourth insulating patterns 254 may be disposed on the first insulating patterns 212 and interposed between the first data storage patterns 248 and between the upper spacers 227.

A plurality of second conductive lines 75 and second gap-fill patterns 78 filling spaces between the plurality of second conductive lines 75 may be arranged on the first memory region LS. A second memory region US may be disposed on the plurality of second conductive lines 75 and the second gap-fill patterns 78, and a plurality of third conductive lines 175 may be formed on the second memory region US.

As described above in some embodiments, the second memory region US may be formed by rotating the first memory region LS 90 degrees in the direction parallel to the surface 3S of the substrate 3. Accordingly, the second memory region US may include a plurality of second data storage structures 351, a plurality of second selector structures 169, first insulating patterns 312, second insulating patterns 324, third insulating patterns 333, fourth insulating patterns 333, upper spacers 327, and interlayer insulating patterns 172, having one-to-one correspondence with the plurality of first data storage structures 251, the plurality of first selector structures 69, the first insulating patterns 212, the second insulating patterns 224, the third insulating patterns 233, the fourth insulating patterns 254, the upper spacers 227, and the interlayer insulating patterns 72 in the first memory region LS. Each of the plurality of second data storage structures 351 may include the second lower data storage electrodes 340, the second data storage pattern 348, and the second upper data storage electrode 345, the same as those described with reference to FIG. 12. The second lower data storage electrodes 340 may include first portions 341a1 and 341a2 respectively corresponding to the first portions 241a1 and 241a2 of the first lower data storage electrodes 240 and rotated 90 degrees.

The first data storage patterns 248 may have flat bottom surfaces and flat top surfaces. However, the present inventive concept is not limited thereto, and the first data storage patterns 248 may be variously modified. Various modified examples of the first data storage patterns 248 will be described with reference to FIGS. 15, 16, and 17. Hereinafter, one of the first data storage patterns 248 will be mainly described with reference to FIGS. 15, 16, and 17.

Figure 15:
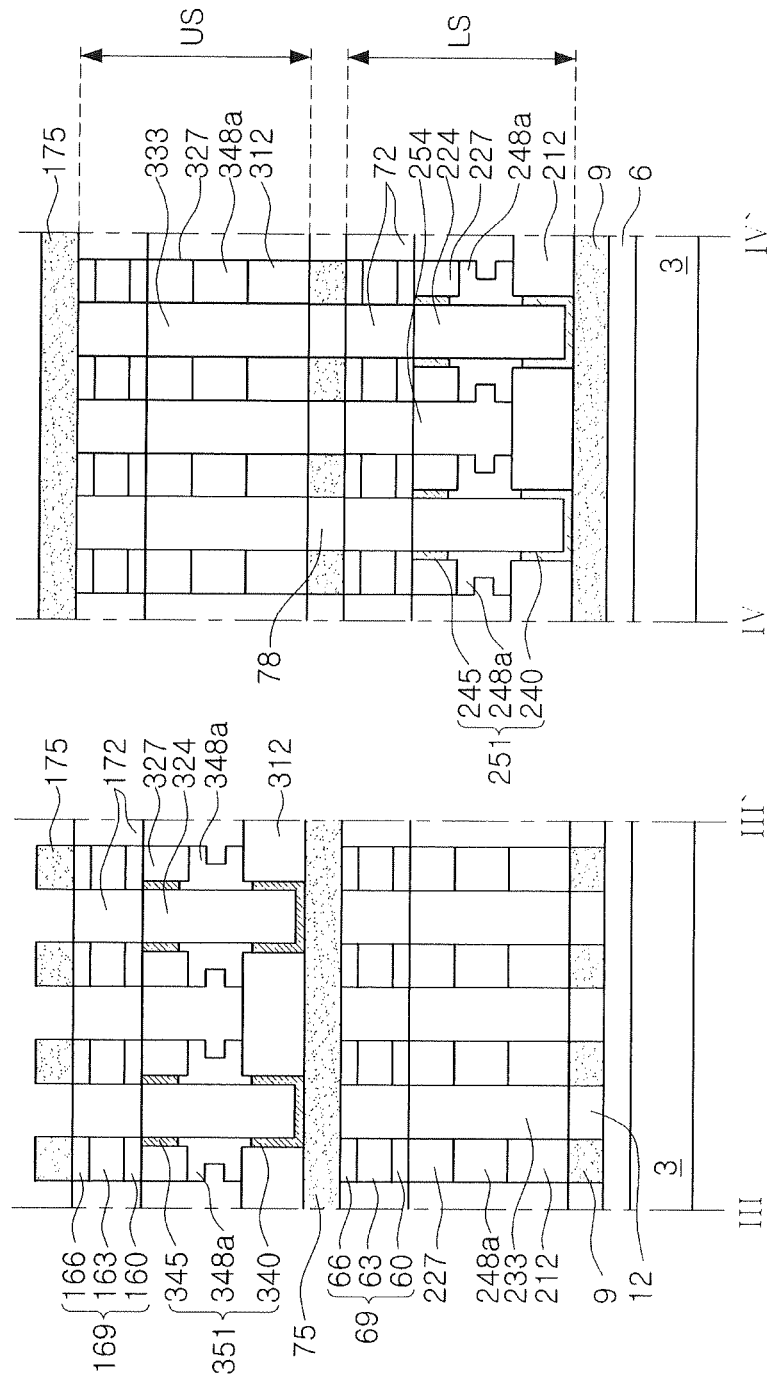
FIG. 15 is a cross-sectional view illustrating another example of a semiconductor device according to an example embodiment of the present inventive concept.

First, Referring to FIG. 15, a modified first data storage pattern 248a of the first memory region LS may include a lower extension portion extending downwardly from a portion of a bottom surface thereof to be in contact with a top surface of the first lower data storage electrodes 240, and an upper extension portion extending upwardly from a portion of a top surface thereof and in contact with a bottom surface of the first upper data storage electrode 245. The lower extension portion and the upper extension portion of the first data storage pattern 248a may have substantially the same width as the first lower data storage electrodes 240 and the first upper data storage electrode 245. The second memory region US may include a second data storage pattern 348a corresponding to the first data storage pattern 248a.

Figure 16:
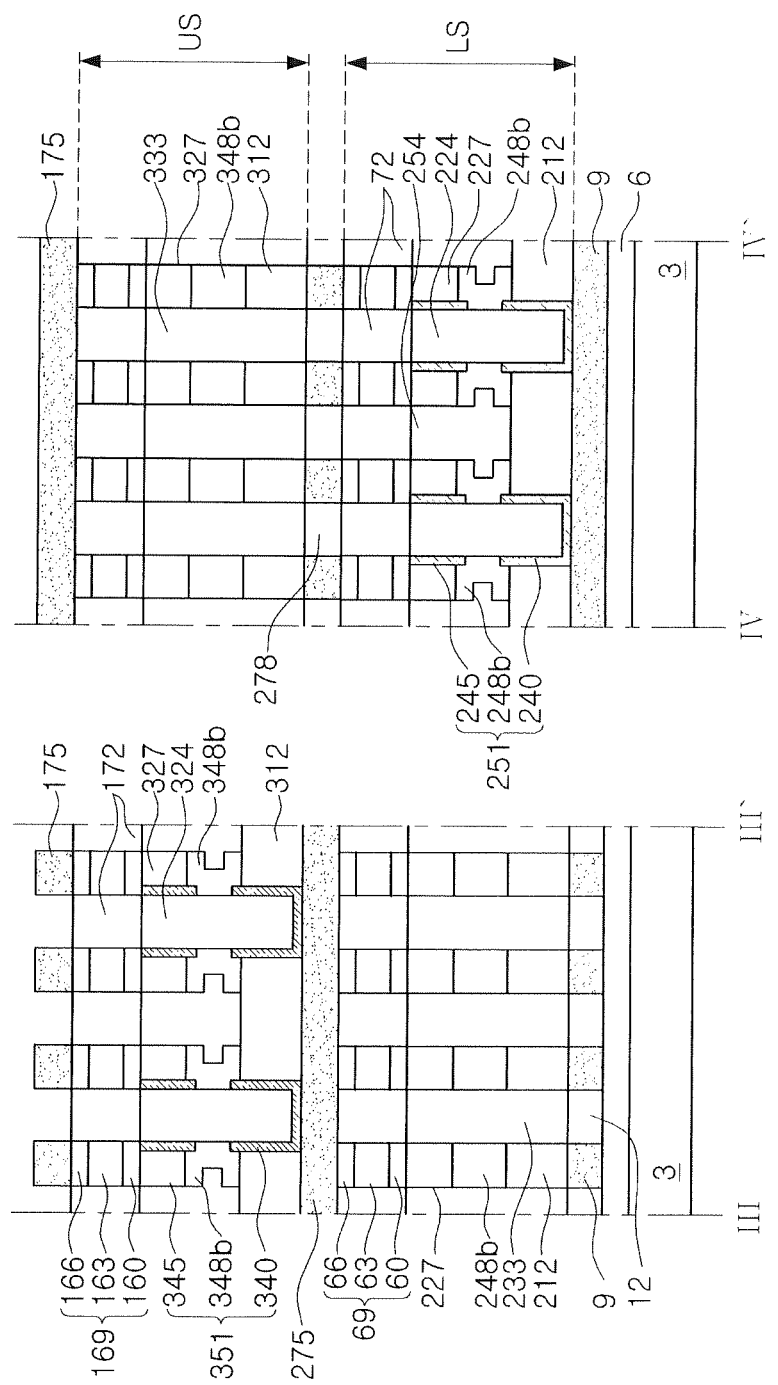
FIG. 16 is a cross-sectional view illustrating another example of a semiconductor device according to an example embodiment of the present inventive concept.

Next, referring to FIG. 16, a modified first data storage pattern 248b of the first memory region LS may include an extension portion extending downwardly from a portion of a bottom surface thereof to be in contact with a side surface of the first lower data storage electrodes 240, and an extension portion extending upwardly from a portion of a top surface thereof to be in contact with a side surface of the first upper data storage electrode 245. The second memory region US may include a second data storage pattern 348b corresponding to the first data storage pattern 248b.

Figure 17:
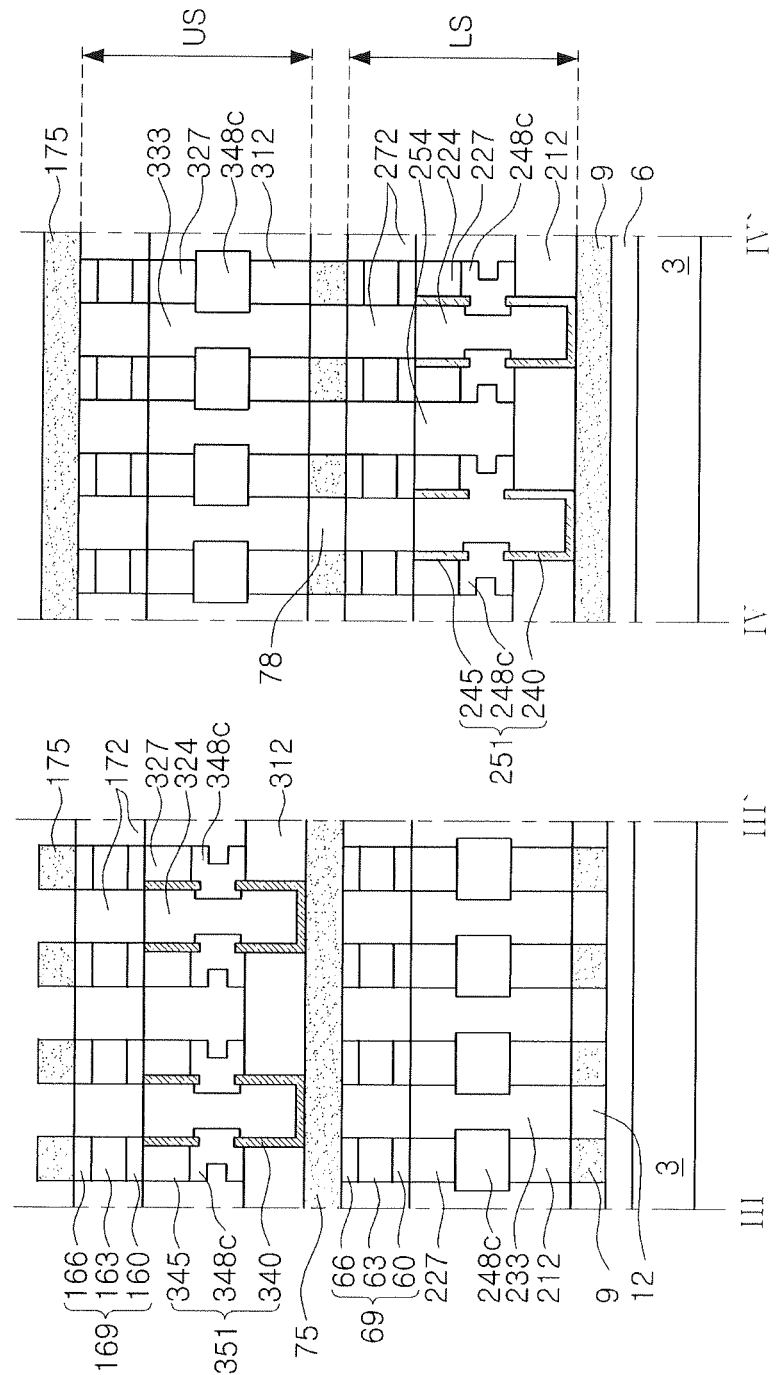
FIG. 17 is a cross-sectional view illustrating another example of a semiconductor device according to an example embodiment of the present inventive concept.

Next, referring to FIG. 17, a modified first data storage pattern 248c of the first memory region LS may surround and be in contact with a top surface and upper side surfaces of the first lower data storage electrodes 240, and a bottom surface and lower side surfaces of the first upper data storage electrode 245. The second memory region US may include a second data storage pattern 348c corresponding to the first data storage pattern 248c.

Figure 18:
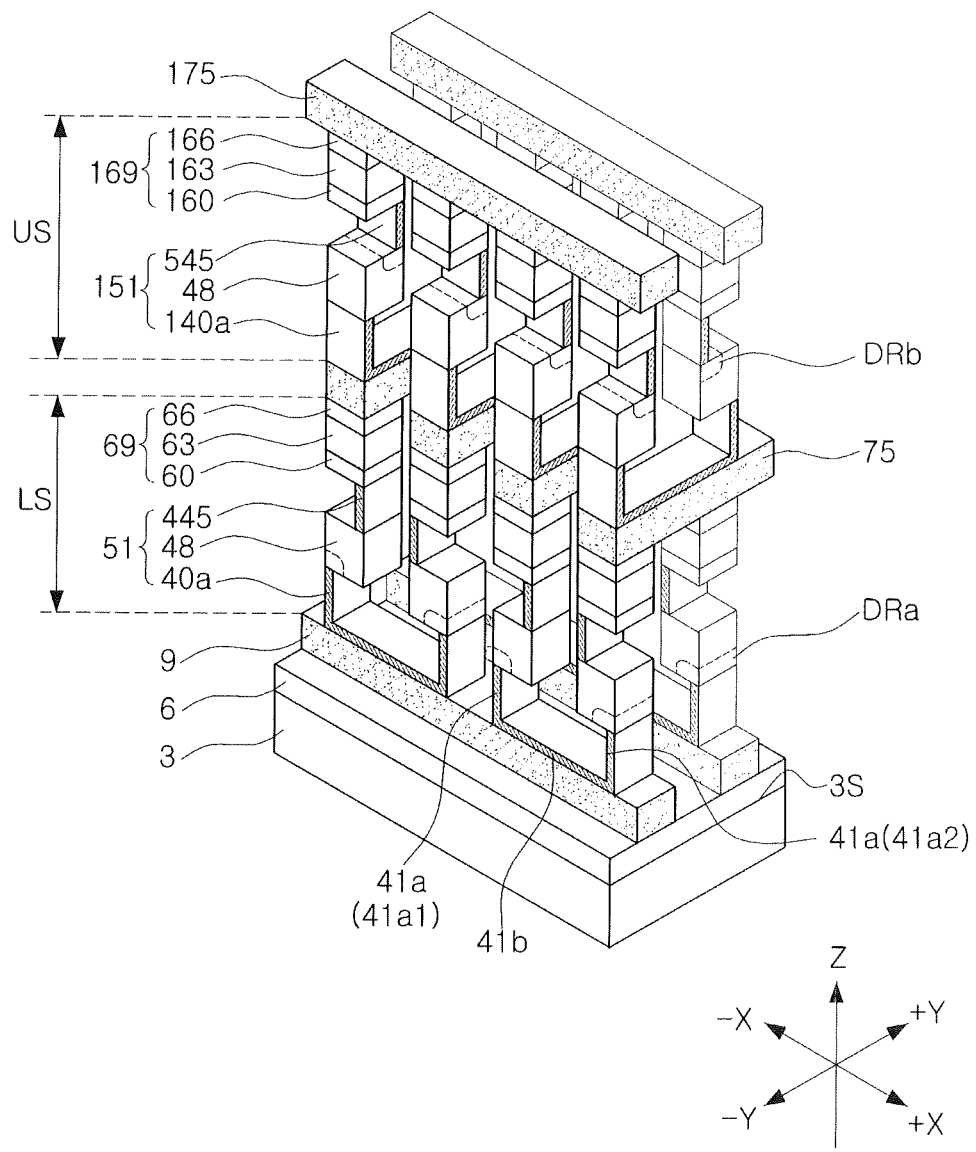
FIG. 18 is a perspective view illustrating another example of a semiconductor device according to an example embodiment of the present inventive concept.

Referring again to FIG. 2, the first upper data storage electrodes 45 may be vertically aligned with the first portions 41a of the first lower data storage electrodes 40. However, the present inventive concept is not limited thereto. First upper data storage electrodes that are not vertically aligned with the first portions 41a of the first lower data storage electrodes 40a will be described with reference to FIG. 18. FIG. 18 is a perspective view illustrating another example of the semiconductor device 1 according to the example embodiment of the present inventive concept.

Referring to FIG. 18, a modified first upper data storage electrodes 445 that are not vertically aligned with the first portions 41a of the first lower data storage electrodes 40a may be provided. The first upper data storage electrodes 445 may be disposed on the first data storage patterns 48 and may not overlap the first portions 41a of the first lower data storage electrodes 40a. The second memory region US may include second upper data storage electrodes 545 corresponding to the first upper data storage electrodes 445.

Figure 19:
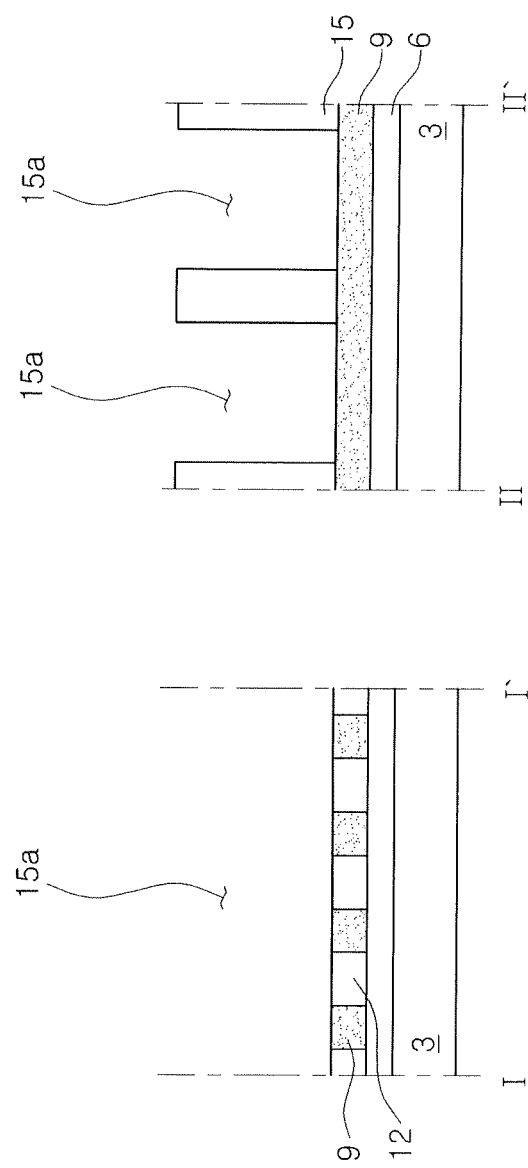
FIGS. 19 to 30 are cross-sectional views illustrating methods of forming semiconductor devices according to example embodiments of the present inventive concept.

Next, methods of forming semiconductor devices according to example embodiments of the present inventive concept will be described. FIGS. 19, 20A, 21, 22, 23, 24A, and 25 to 30 are cross-sectional views illustrating a method of forming a semiconductor device according to an example embodiment of the present inventive concept, and FIG. 20B is a cross-sectional view illustrating a method of forming a semiconductor device according to another example embodiment of the present inventive concept, and FIG. 24B is a partly enlarged view illustrating a method of forming a semiconductor device according to another example embodiment of the present inventive concept. FIGS. 19, 20A, 20B, 21, 22, 23, 24A, and 25 to 30 are cross-sectional views illustrating regions taken along lines I-I' and II-IF of FIGS. 3A and 3B.

First, a method of forming a semiconductor device according to an example embodiment of the present inventive concept will be described with reference to FIGS. 19, 20A, 21, 22, 23, 24A, and 25 to 30.

Referring to FIGS. 3A, 3B, and 19B, a base insulating layer 6 may be formed on a substrate 3. The substrate 3 may be a semiconductor substrate. The base insulating layer 6 may be formed of silicon oxide. First conductive lines 9 may be formed on the base insulating layer 6. First gap-fill patterns 12 filling spaces between the first conductive lines 9. The first gap-fill patterns 12 may be formed of silicon oxide or silicon nitride. A first insulating pattern 15 having a line-shaped opening 15a may be formed on the first conductive lines 9 and the first gap-fill patterns 12. The opening 15a of the first insulating pattern 15 may be a line shape extending in a direction perpendicular to the first conductive lines 9.

Figure 20A:
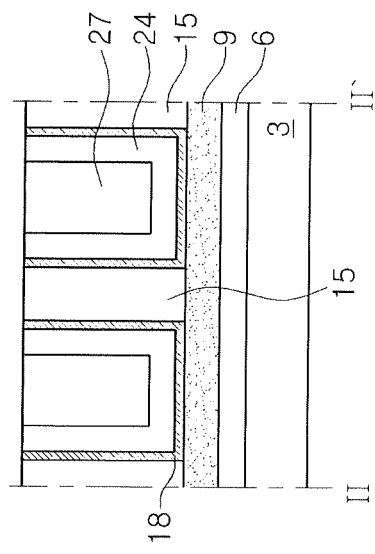
Figure 20A:
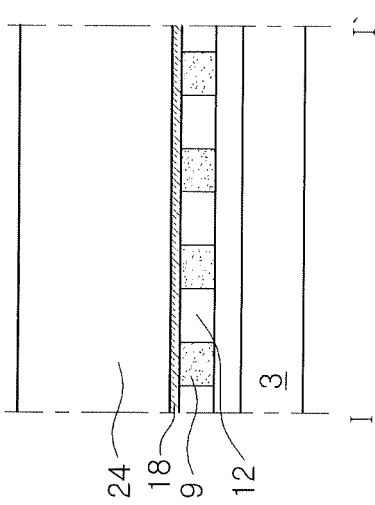
Figure 20B:
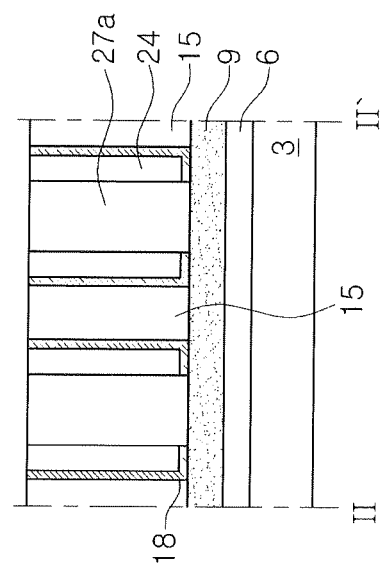
Figure 20B:
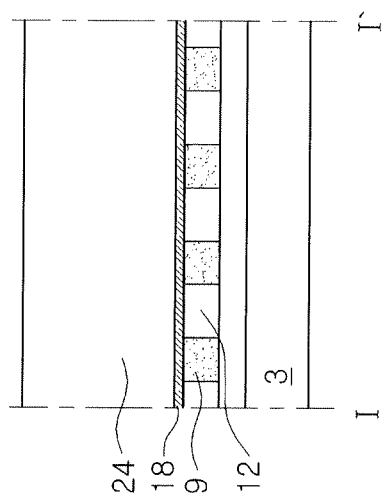

Referring to FIGS. 3A, 3B, and 20A, a data storage electrode layer 18, a spacer 24, and a second insulating pattern 27 filling the opening (reference numeral 15a in FIG. 19) of the first insulating pattern 15 may be formed.

The process of forming the data storage electrode layer 18, the spacer 24, and the second insulating pattern 27 may include conformally forming a conductive material layer on the substrate 3 having the first insulating pattern 15, conformally forming a spacer material layer on the conductive material layer, forming an insulating layer filling a remaining portion of the opening (reference numeral 15a in FIG. 19) of the first insulating pattern 15 on the spacer material layer, and performing a planarization process until the first insulating pattern 15 is exposed. The conductive material layer may be planarized to be the data storage electrode layer 18, the spacer material layer may be planarized to be the spacer 24, and the insulating layer may be planarized to be the second insulating pattern 27. Accordingly, the spacer 24 may be formed to have a shape surrounding side and bottom surfaces of the second insulating pattern 27, and the data storage electrode layer 18 may be formed to have a shape surrounding the outside of the spacer 24. However, the present inventive concept is not limited thereto. For example, as illustrated in FIG. 20B, the process of forming the data storage electrode layer 18, the spacer 24, and the second insulating pattern 27 may include conformally forming a conductive material layer on the substrate 3 having the first insulating pattern 15, conformally forming a spacer material layer on the conductive material layer, anisotropically etching the spacer material layer and the conductive material layer until the first conductive line 9 is exposed, forming an insulating layer filling a remaining portion of the opening (reference numeral 15a in FIG. 19) of the first insulating pattern 15, and planarizing the insulating layer until the first insulating pattern 15 is exposed. As, the result of the process illustrated in FIG. 20B may be used to form the modified semiconductor device described with reference to FIG. 11A. Hereinafter, a method of forming a semiconductor device using a resultant product as illustrated in FIG. 20A instead of a resultant product as illustrated in FIG. 20B, will be described.

Figure 21:
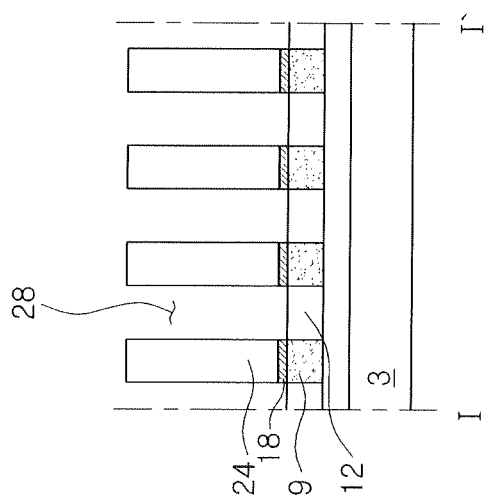

Referring to FIGS. 3A, 3B, and 21, a patterning process may be performed to form openings 28 exposing the first gap-fill patterns 12.

Figure 22:
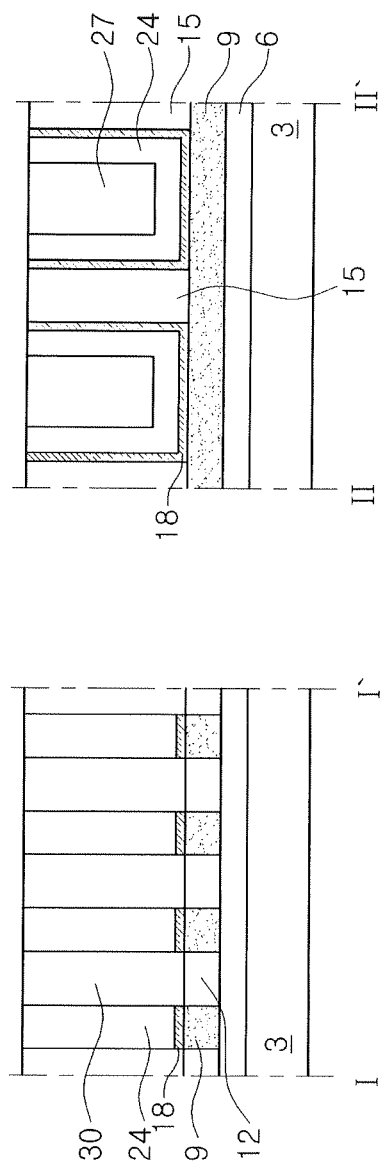

Referring to FIGS. 3A, 3B, and 22, third insulating patterns 30 may be formed to fill the openings (reference numeral 28 in FIG. 21).

Figure 23:
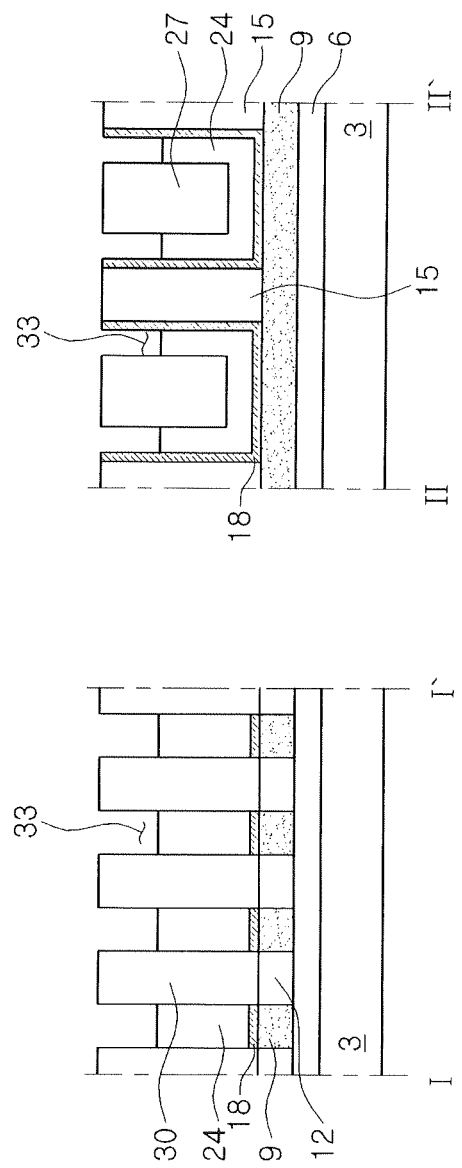

Referring to FIGS. 3A, 3B, and 23, the spacer 24 may be partially etched to form holes 33.

Figure 24A:
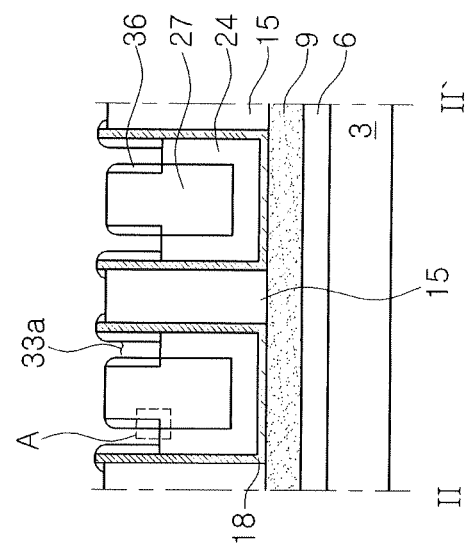
Figure 24A:
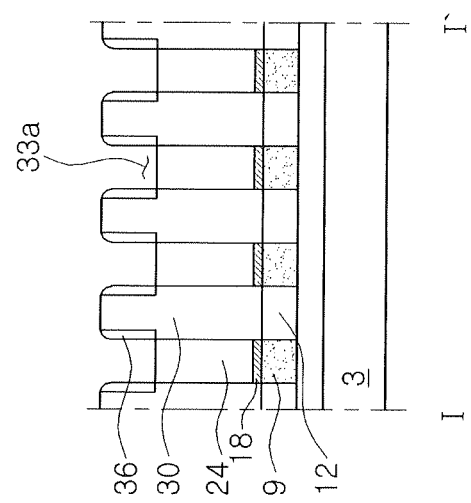
Figure 24B:
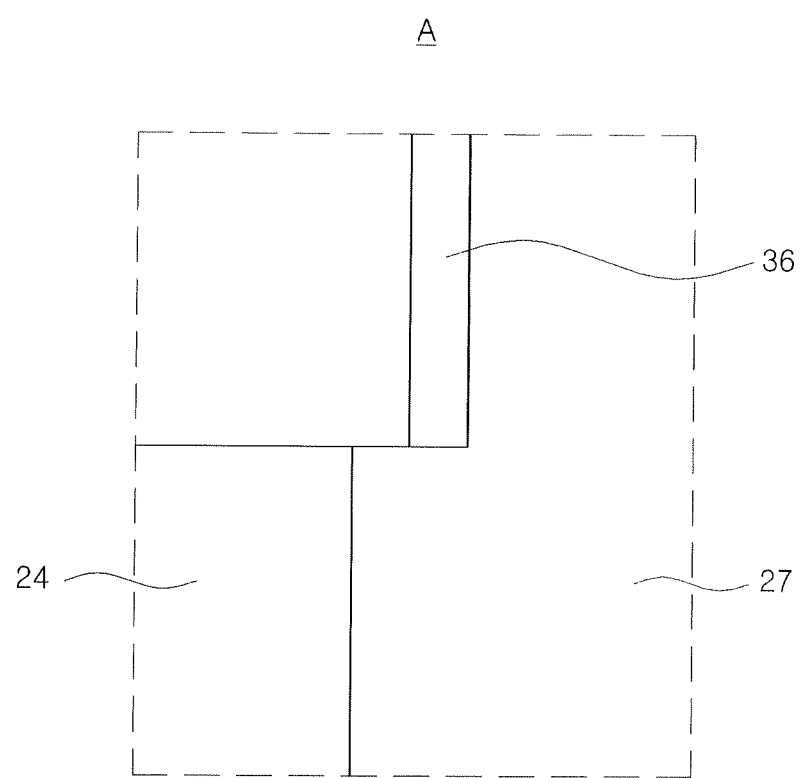

Referring to FIGS. 3A, 3B, and 24, enlarged holes 33a may be formed by performing an etching process for enlarging sizes of the holes (reference numeral 33 in FIG. 23). The etching process for enlarging the sizes of the holes (reference numeral 33 in FIG. 23) may be a process of selectively and isotropically etching the second and third insulating patterns 27 and 30. Next, first upper spacers 36 may be formed on side surfaces of the enlarged holes 33a.

In some example embodiments, the first upper spacers 36 may be formed to expose the spacers 24.

In some example embodiments, the first upper spacers 36 may be formed to expose the spacers 24 and partially expose the third insulating patterns 30 in contact with the spacers 24f, as illustrated in FIG. 24B.

Figure 25:
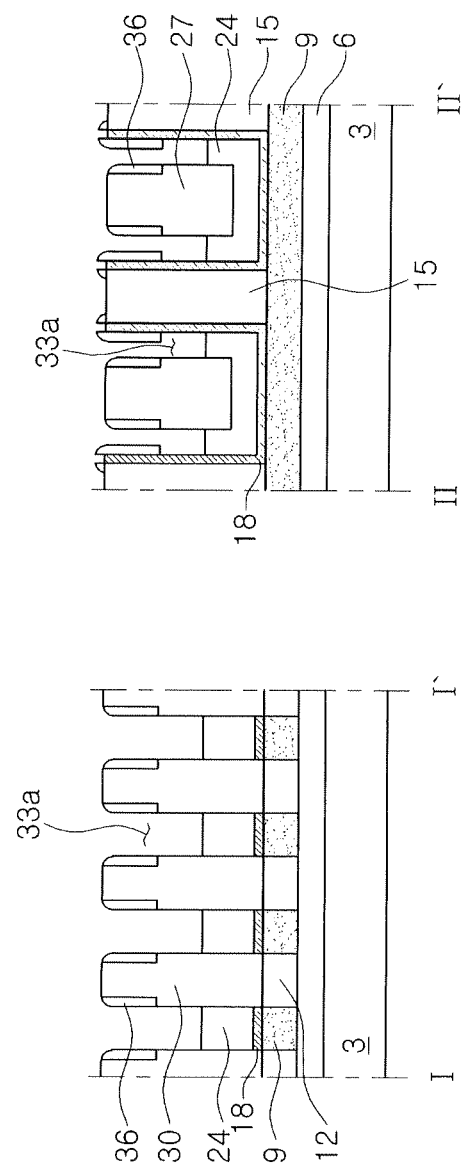

Referring to FIGS. 3A, 3B, and 25, spacer patterns 24 may be formed by selectively etching the spacers 24. Accordingly, side surfaces of the data storage electrode layer 18 may be partially exposed by the enlarged holes 33a while forming the spacer patterns 24.

Figure 26:
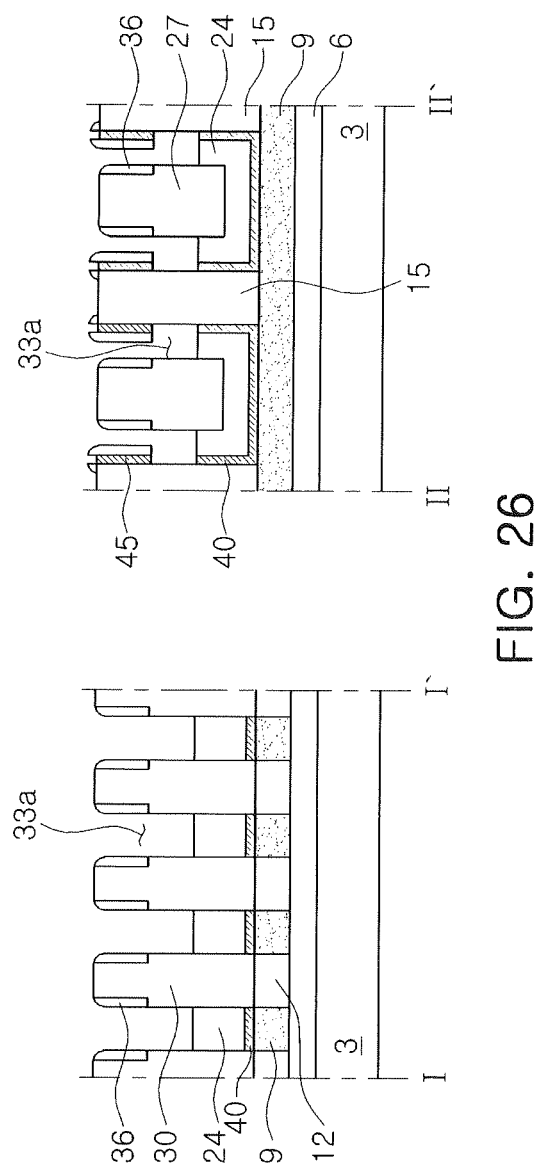

Referring to FIGS. 3A, 3B, and 26, the data storage electrode layer (reference numeral 18 in FIG. 25) exposed by the enlarged holes 33a may be selectively etched. Accordingly, the data storage electrode layer (reference numeral 18 in FIG. 25) may be separated into lower portions and upper portions respectively to be first lower data storage electrodes 40 and first upper data storage electrodes 45.

Figure 27:
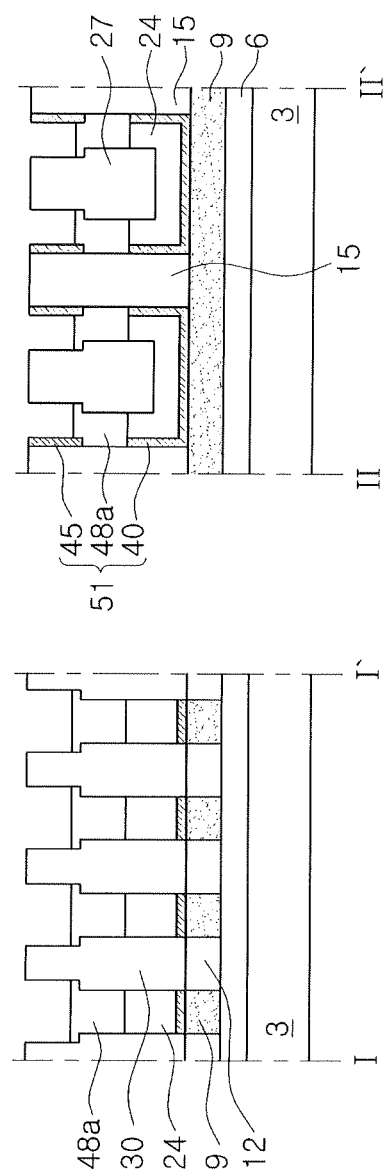

Referring to FIGS. 3A, 3B, and 27, in some example embodiments, the upper spacers 36 may be removed. Next, first data storage patterns 48a partially filling the enlarged holes (reference numeral 33a in FIG. 26) may be formed. The first data storage patterns 48a may be in contact with upper portions of the first lower data storage electrodes 40 and lower portions of the first upper data storage electrodes 45.

In other example embodiments, in order to form the modified semiconductor device illustrated in FIG. 5, the first data storage patterns 48a partially filling the enlarged holes (reference numeral 33a in FIG. 26) may be formed without performing the process of removing the upper spacers 36.

Figure 28:
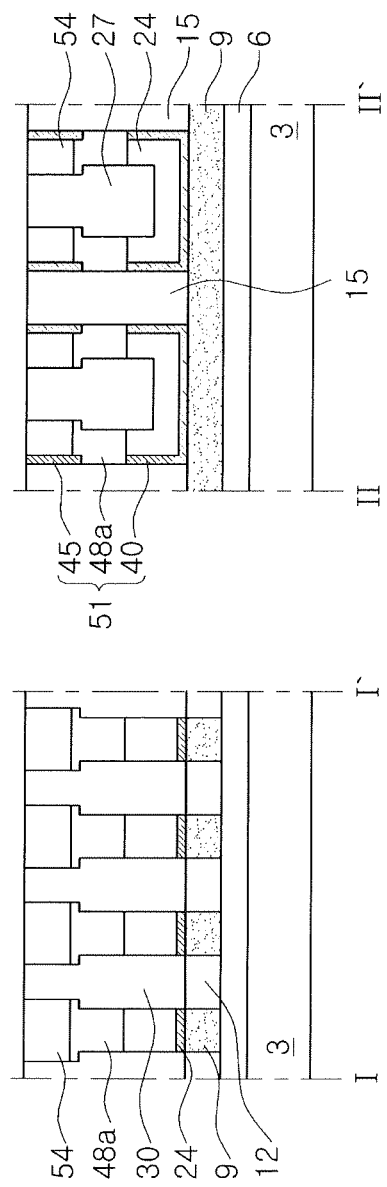

Referring to FIGS. 3A, 3B, and 28, capping patterns 54 filling the remaining portions of the enlarged holes (reference numeral 33a in FIG. 26) may be formed on the first data storage patterns 48a. The capping patterns 54 may be formed of an insulating material such as silicon oxide or silicon nitride.

In other example embodiments, in order to form the modified semiconductor device illustrated in FIG. 6, a process of forming conductive patterns (reference numeral 57 in FIG. 6) filling the remaining portions of the enlarged holes (reference numeral 33a in FIG. 26) may be further included after partially etching the capping patterns 54.

Figure 29:
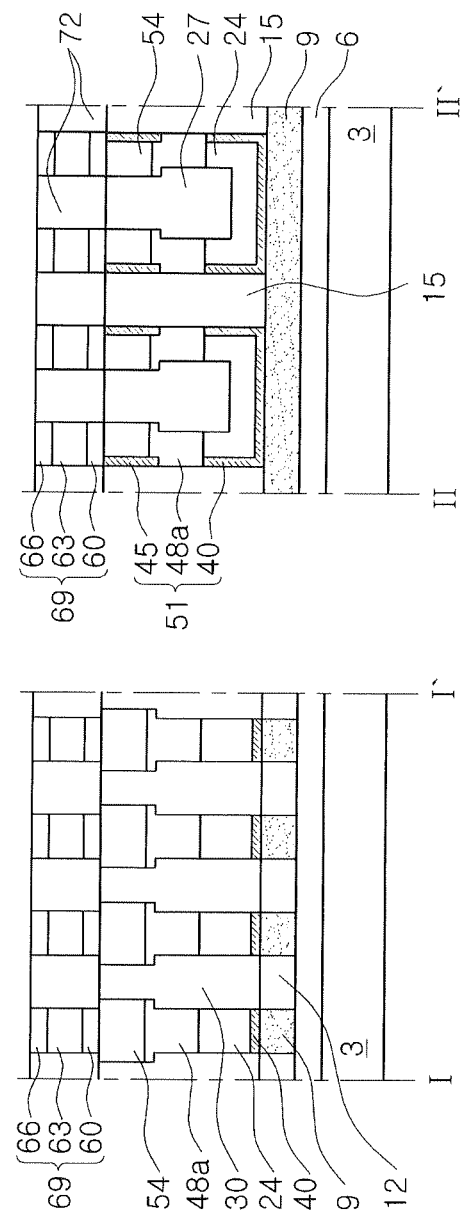

Referring to FIGS. 3A, 3B, and 29, first selector structures 69 may be formed on the substrate having the capping patterns 54, and interlayer insulating patterns 72 may be formed to surround side surfaces of the first selector structures 69. Each of the first selector structures 69 may include a first lower selector electrode 60, a first selector pattern 63, and a first upper selector electrode 66, sequentially stacked.

Figure 30:
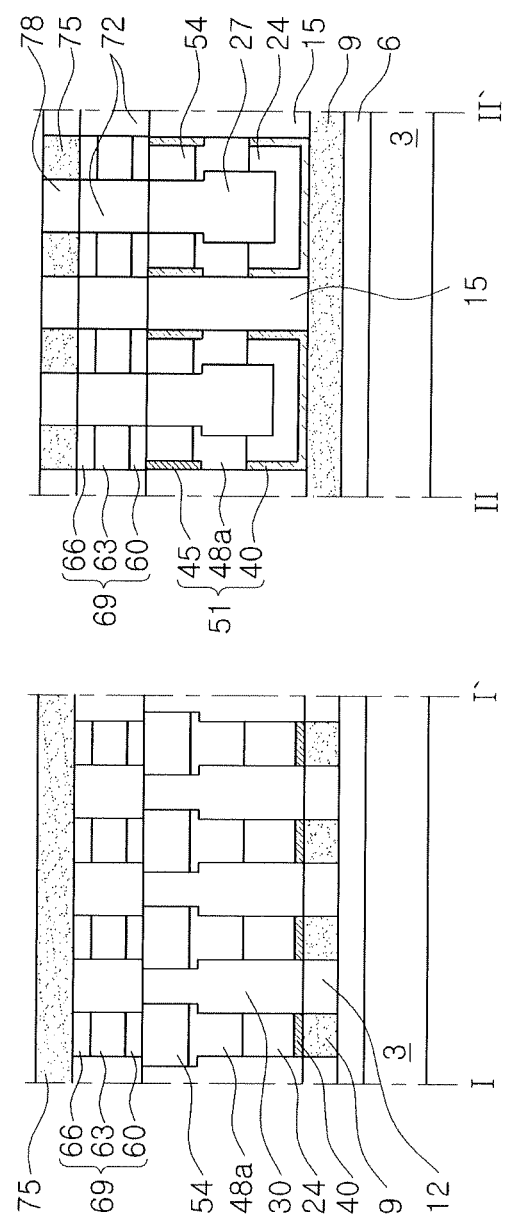

Referring to FIGS. 3A, 3B, and 30, second conductive lines 75 may be formed on the first selector structures 69 and the interlayer insulating patterns 72, and second gap-fill patterns 78 filling spaces between the second conductive lines 75 may be formed.

Referring again to FIGS. 3A and 3B and FIGS. 4A and 4B, after rotating the substrate having the second conductive lines 75 and the second gap-fill patterns 78 90 degrees in a horizontal direction, the processes described with reference to FIGS. 19, 20A, 21, 22, 23, 24A, and 25 to 30 may be repeatedly performed. Accordingly, the semiconductor device described with reference to FIGS. 3A and 3B and FIGS. 4A and 4B may be formed.

Next, a method of forming the semiconductor device described with reference to FIGS. 13A, 13B, and 14 will be described with reference to FIGS. 31 to 43. FIGS. 31 to 43 are cross-sectional views illustrating regions taken along lines and IV-IV' of FIGS. 13A and 13B.

Figure 31:
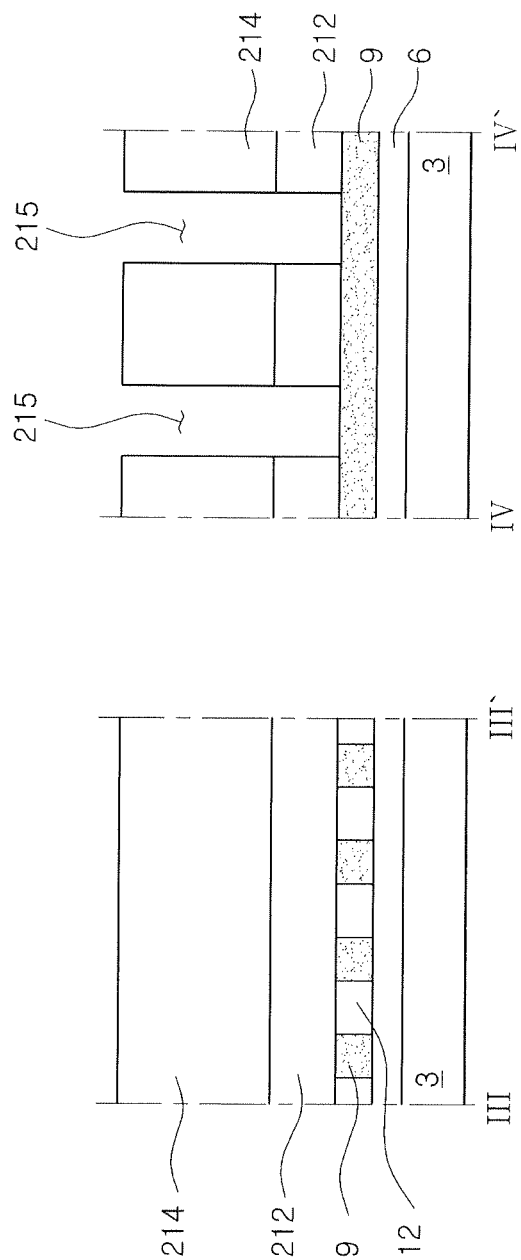
FIGS. 31 to 43 are cross-sectional views illustrating methods of forming semiconductor devices according to other example embodiments of the present inventive concept.

Referring to FIGS. 13A, 13B, and 31, the first conductive lines 9 and the first gap-fill patterns 12 may be formed on the base insulating layer 6 of the substrate 3, similarly to those described with reference to FIG. 19.

First insulating patterns 212 and first sacrificial patterns 214, sequentially stacked on the first conductive lines 9 and the first gap-fill patterns 12, may be formed. The formation of the first insulating patterns 212 and the first sacrificial patterns 214 may include sequentially forming an insulating layer and a sacrificial layer on the first conductive lines 9 and the first gap-fill patterns 12, and forming the first insulating patterns 212 and the first sacrificial patterns 214 and openings 215 exposing the first conductive lines 9 by patterning the insulating layer and the sacrificial layer. The first insulating patterns 212 may be formed of silicon nitride, and the first sacrificial patterns 214 may be formed of silicon oxide.

Figure 32:
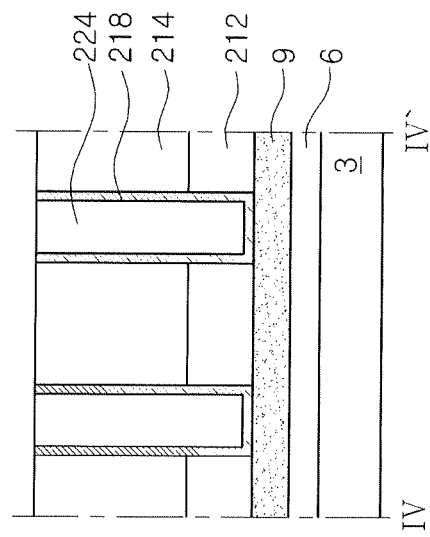
Figure 32:
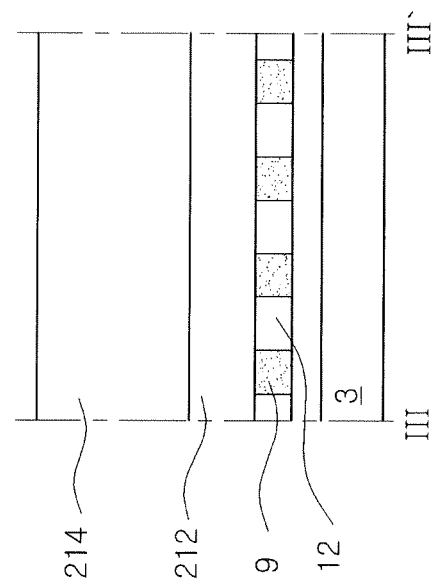

Referring to FIGS. 13A, 13B, and 32, data storage electrodes 218 conformally covering inner walls of the openings (reference numeral 215 of FIG. 31) may be formed. Second insulating patterns 224 filling the openings (reference numeral 215 of FIG. 31) may be formed on the data storage electrodes 218.

Figure 33:
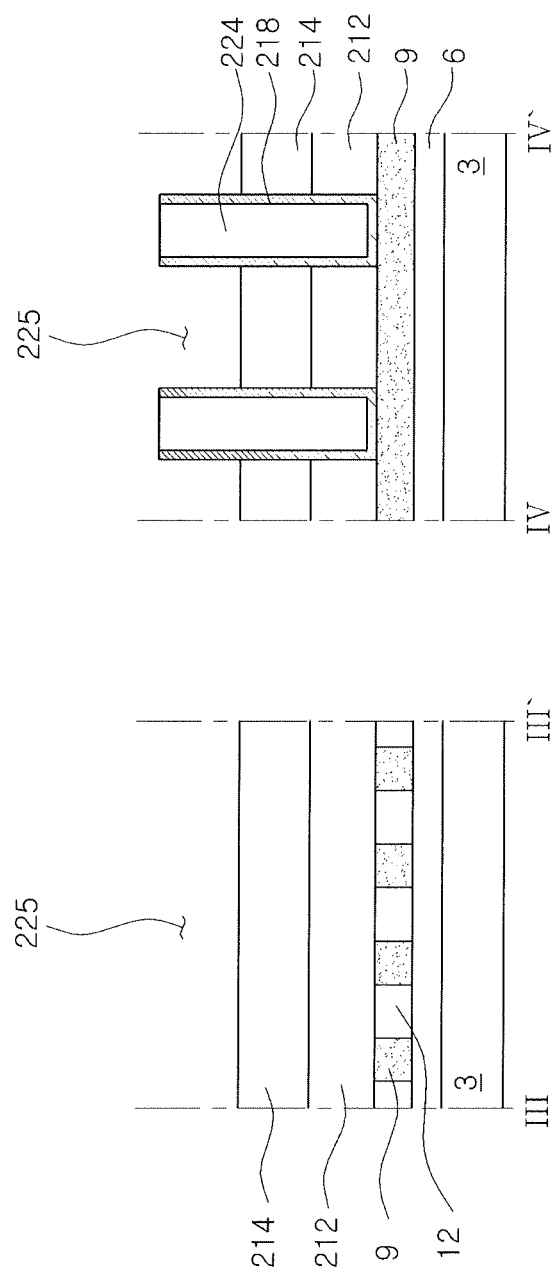

Referring to FIGS. 13A, 13B, and 33, the first sacrificial patterns 214 may be partially etched to form openings 225 exposing upper side surfaces of the data storage electrodes 218.

Figure 34:
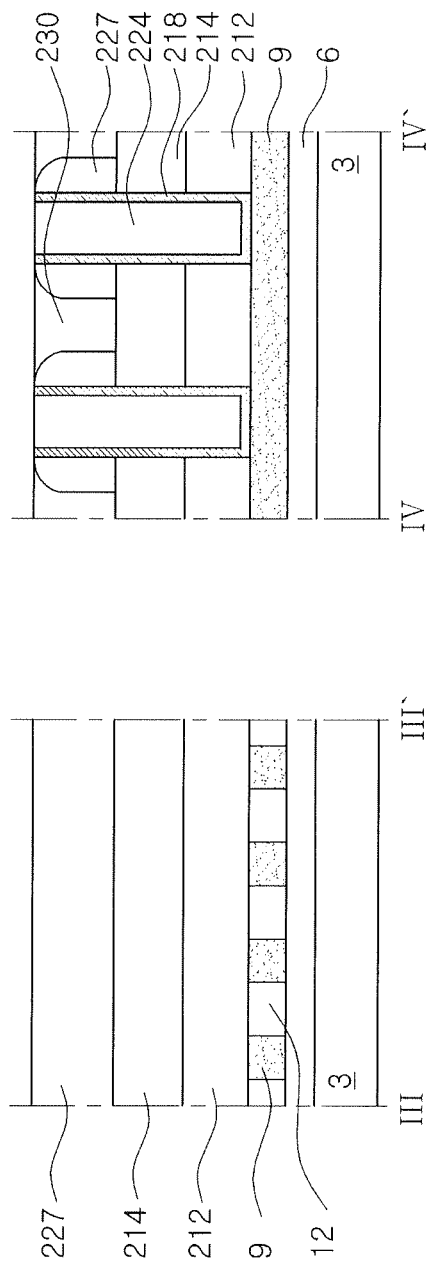

Referring to FIGS. 13A, 13B, and 34, upper spacers 227 may be formed on the upper side surfaces of the data storage electrodes 218 exposed by the openings (reference numeral 225 of FIG. 33), and second sacrificial patterns 230 filling the remaining portions of the openings (reference numeral 225 of FIG. 33) may be formed. The upper spacers 227 may be formed of an insulating material such as silicon nitride, and the second sacrificial patterns 230 may be formed of silicon oxide.

Figure 35:
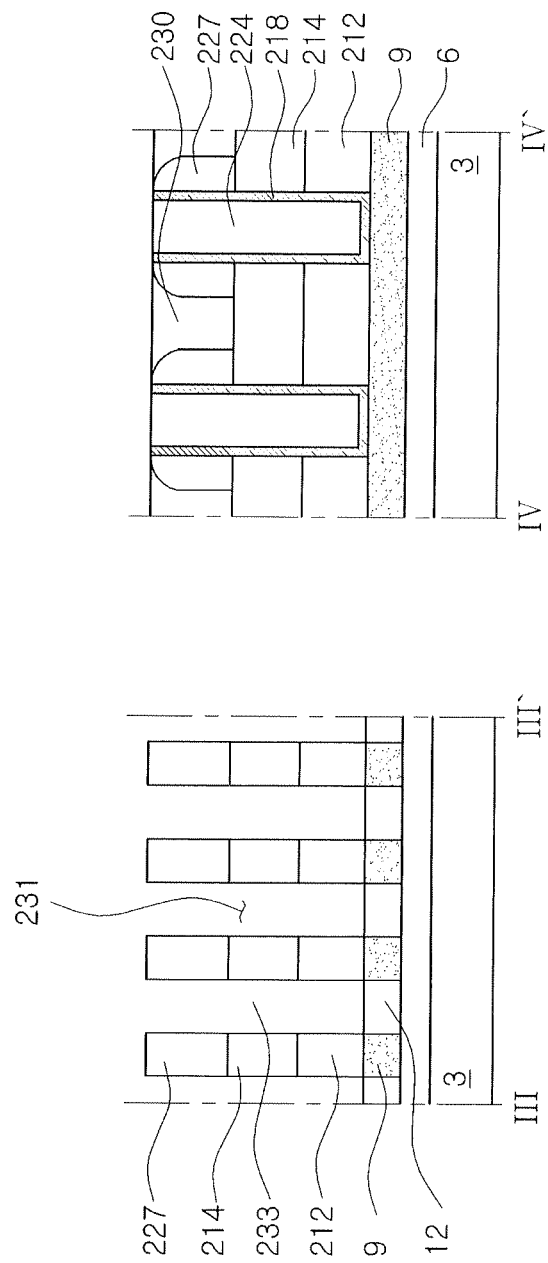

Referring to FIGS. 13A, 13B, and 35, openings 231 exposing the first gap-fill patterns 12 may be formed by performing a patterning process. The openings 231 may have a line shape.

Figure 36:
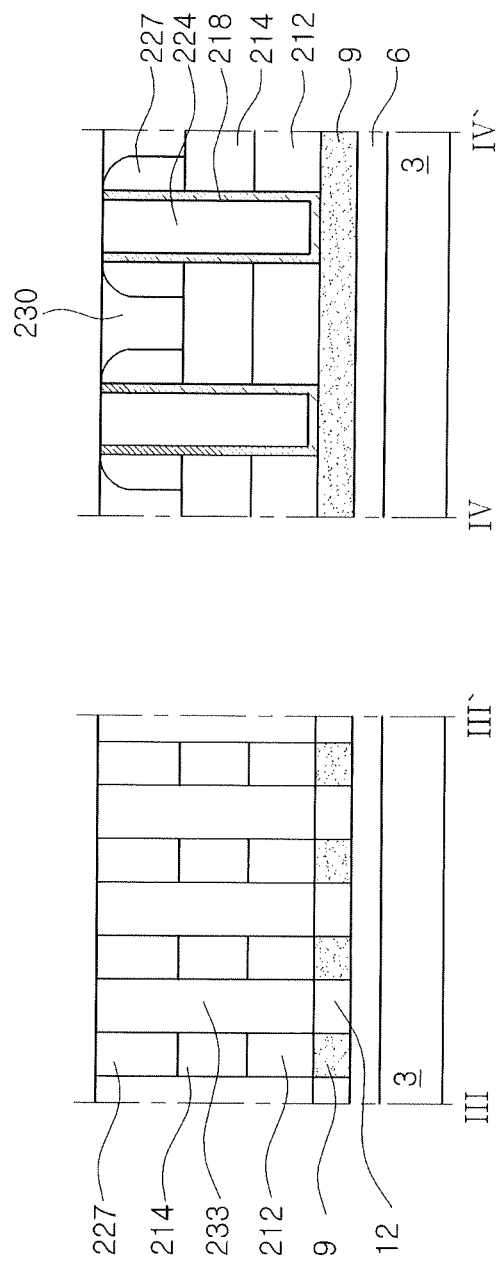

Referring to FIGS. 13A, 13B, and 36, third insulating patterns 233 filling the openings (reference numeral 231 of FIG. 35) may be formed. The first to third insulating patterns 212, 224, and 233 and the upper spacers 227 may be formed of the same material, such as silicon nitride.

Figure 37:
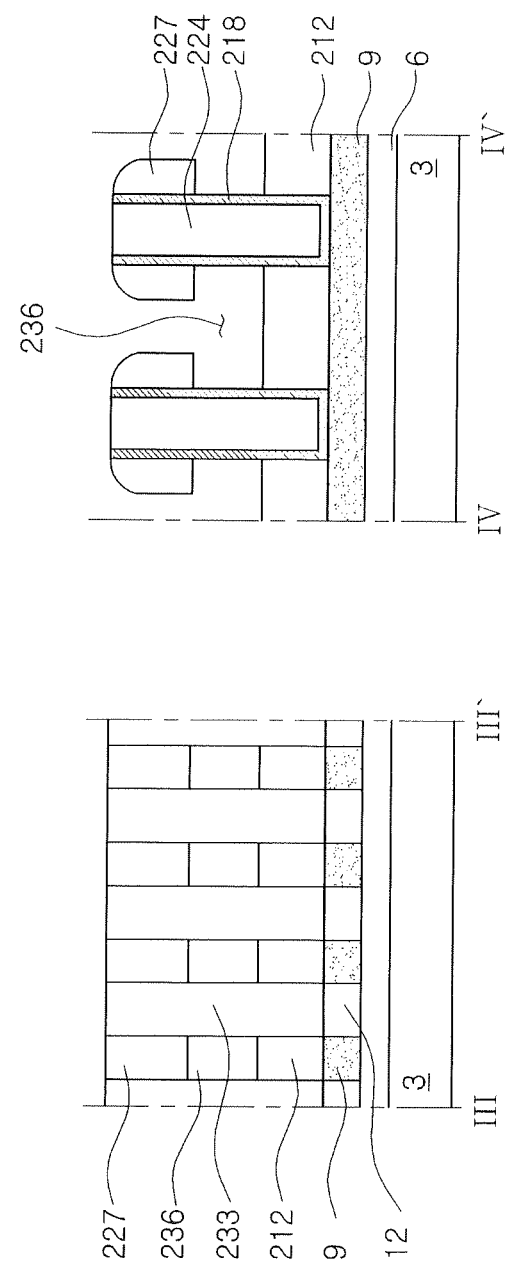

Referring to FIGS. 13A, 13B, and 37, the first and second sacrificial patterns 214 and 230 may be removed to form openings 236. The openings 236 may partially expose side surfaces of the data storage electrodes 218.

Figure 38:
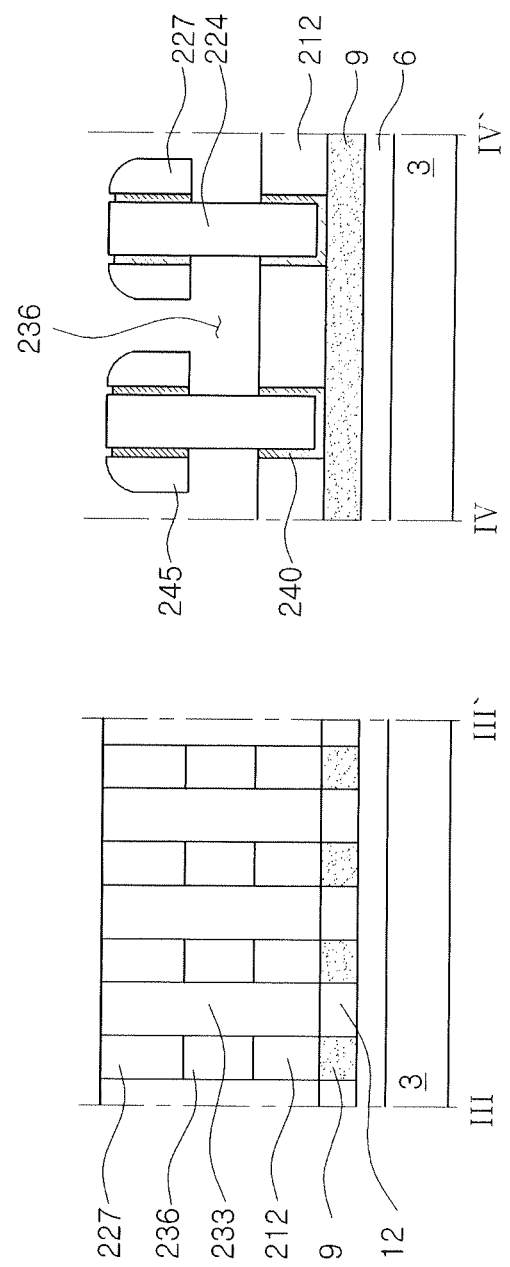

Referring to FIGS. 13A, 13B, and 38, side surfaces of the data storage electrodes (reference numeral 218 of FIG. 37) exposed by the openings 236 may be selectively removed. Accordingly, the data storage electrodes (reference numeral 218 of FIG. 37) may be separated into lower portions and upper portions respectively to form first lower data storage electrodes 240 and first upper data storage electrodes 245.

Figure 39:
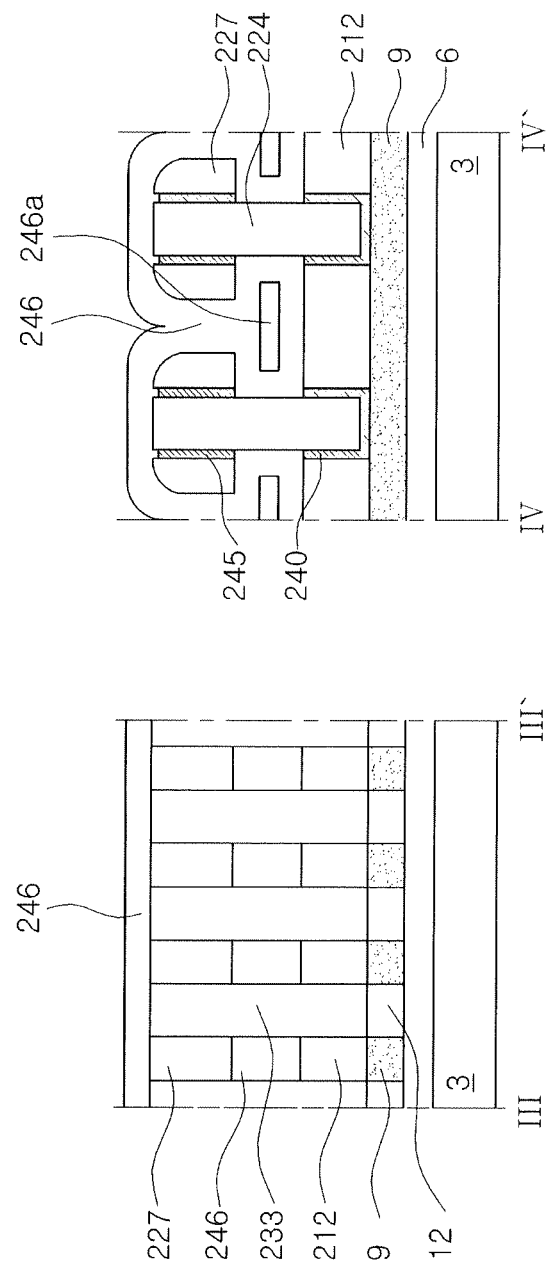

Referring to FIGS. 13A, 13B, and 39, a data storage layer 246 may be formed on the substrate having the first lower data storage electrodes 240 and the first upper data storage electrodes 245. The data storage layer 246 may include spaces 246a thereinside.

Figure 40:
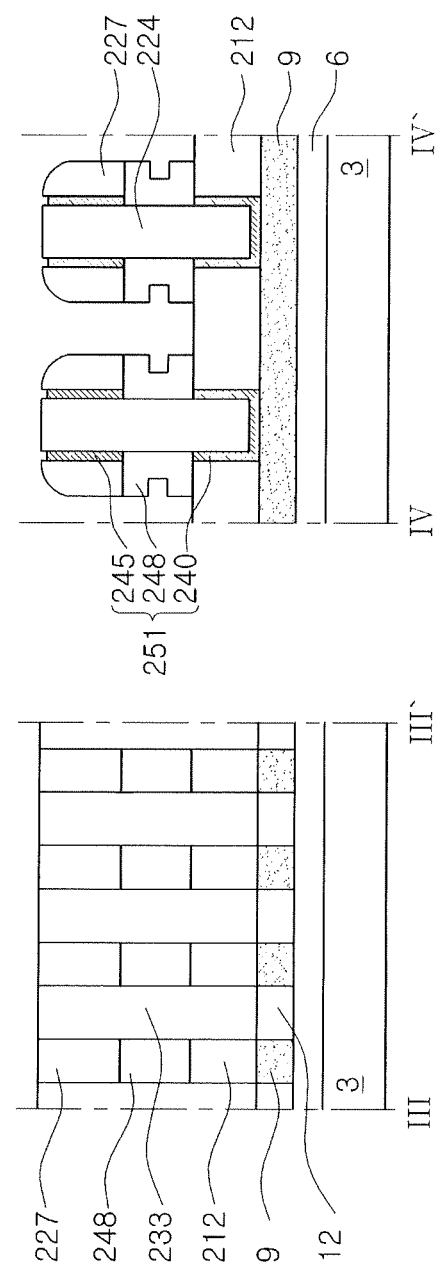

Referring to FIGS. 13A, 13B, and 40, the data storage layer 246 may be anisotropically etched to form first data storage patterns 248. Accordingly, the first data storage structures 251 illustrated in FIG. 14, including the first lower data storage electrodes 240, the first data storage patterns 248, and the first upper data storage electrodes 245, may be formed.

Figure 41:
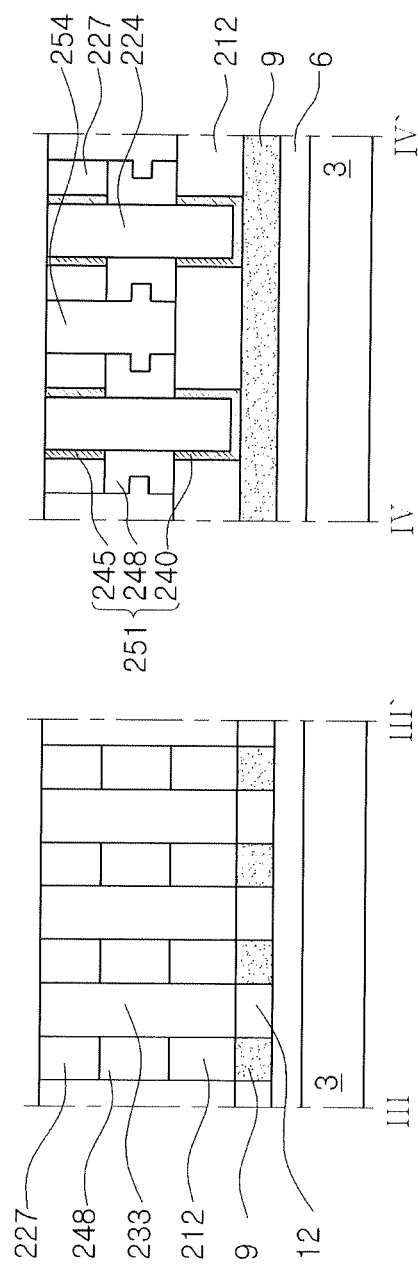

Referring to FIGS. 13A, 13B, and 41, an insulating layer may be formed on the substrate having the first data storage structures 251, and the insulating layer may be planarized to expose the first upper data storage electrodes 245. The insulating layer may be planarized to form fourth insulating patterns 254 interposed between the first data storage patterns 248 and the upper spacers 227.

Figure 42:
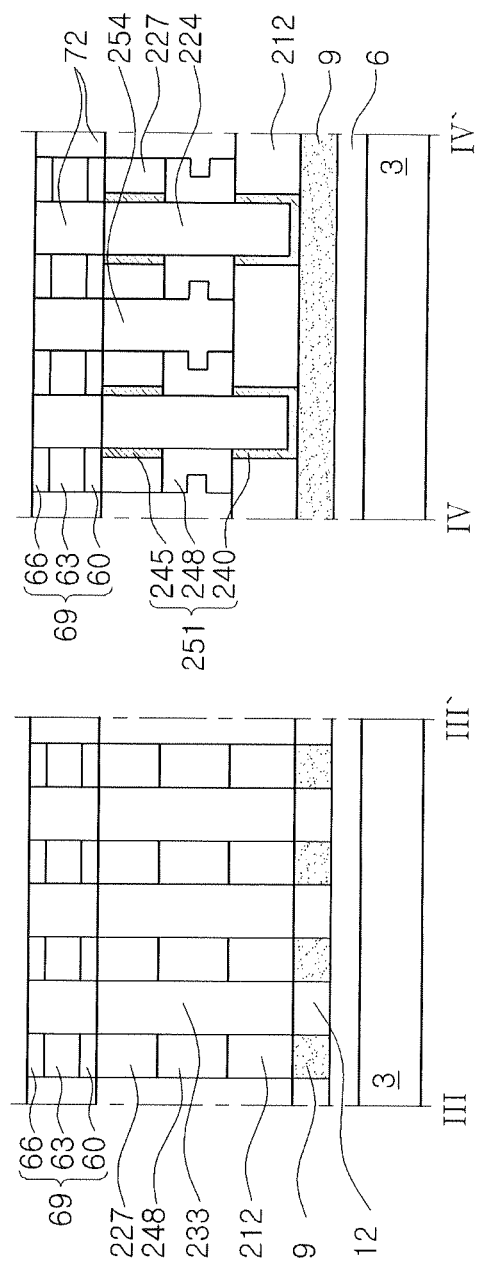

Referring to FIGS. 13A, 13B, and 42, first selector structures 69 may be formed on the substrate having the fourth insulating patterns 254, and interlayer insulating patterns 72 surrounding side surfaces of the first selector structures 69 may be formed. Each of the first selector structures 69 may include a first lower selector electrode 60, a first selector pattern 63, and a first upper selector electrode 66, sequentially stacked.

Figure 43:
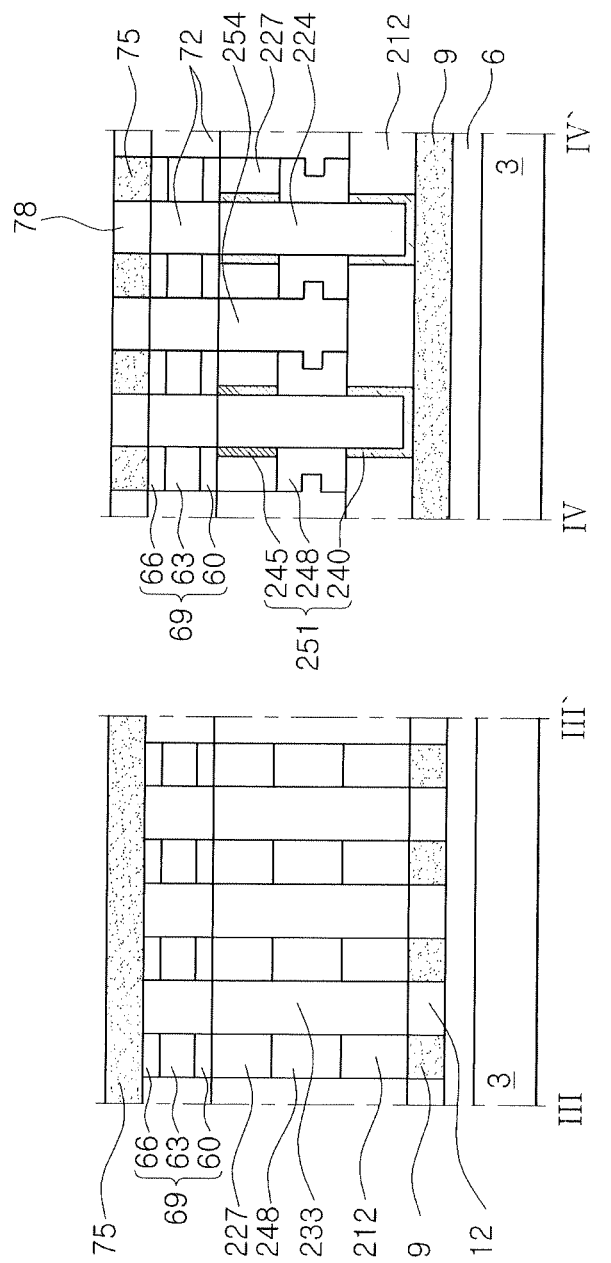

Referring to FIGS. 13A, 13B, and 43, second conductive lines 75 may be formed on the first selector structures 69 and the interlayer insulating patterns 72, and second gap-fill patterns 78 filling spaces between the second conductive lines 75.

Referring again to FIGS. 13A, 13B, and 14, after rotating the substrate having the second conductive lines 75 and the second gap-fill patterns 78 90 degrees in a horizontal direction, the processes described with reference to FIGS. 31 to 43 may be repeatedly performed. Accordingly, the semiconductor device described with reference to FIGS. 13A, 13B, and 14 may be formed.

As set forth above, according to the example embodiments of the present inventive concept, a first word line 9, a bit line 75 arranged on the first word line 9, and a second word line 175 arranged on the bit line 75 may be provided. The first memory region LS including the first data storage region DRa may be arranged between the first word line 9 and the bit line 75, and the second memory region US including the second data storage region DRb may be arranged between the bit line 75 and the second word line 175. Accordingly, the degree of integration may be improved.

According to the example embodiments of the present inventive concept, since the first data storage region DRa and the second data storage region DRb are formed to have the same size or similar sizes, scattering of cell characteristics between the first memory region LS disposed below the bit line 75 and the second memory region US disposed over the bit line 75 may be reduced.

While example embodiments have been shown and described above, it will be apparent to those skilled in the art that modifications and variations could be made without departing from the scope of the present invention as defined by the appended claims.

What is claimed is:

1. A semiconductor device, comprising:
   a first conductive line disposed on a substrate and extending in a first direction, parallel to a surface of the substrate;
   a second conductive line disposed on the first conductive line and extending in a second direction, perpendicular to the first direction and parallel to the surface of the substrate; and
   a first data storage structure and a first selector structure disposed between the first conductive line and the second conductive line and connected in series,
   wherein the first data storage structure includes a first lower data storage electrode, a first data storage pattern disposed on the first lower data storage electrode, and a first upper data storage electrode disposed on the first data storage pattern,
   the first lower data storage electrode includes a first portion facing the first upper data storage electrode and vertically aligned with the first upper data storage electrode,
   the first data storage pattern includes a first side surface and a second side surface facing each other, and
   the first upper data storage electrode and the first portion of the first lower data storage electrode are disposed to be closer to the first side surface of the first data storage pattern than to the second side surface of the first data storage pattern.

2. The semiconductor device of claim 1, wherein the first lower data storage electrode includes a second portion extending from a bottom of the first portion in the first direction, and
   the first data storage pattern is in contact with the first portion of the first lower data storage electrode and spaced apart from the second portion of the first lower data storage electrode.

3. The semiconductor device of claim 2, wherein the first data storage pattern overlaps the second portion.

4. The semiconductor device of claim 1, wherein the first portion of the first lower data storage electrode has a width in the first direction and a length in the second direction greater than the width in the first direction.

5. The semiconductor device of claim 4, wherein the first upper data storage electrode has the same width in the first direction and the same length in the second direction as the first portion of the first lower data storage electrode.

6. The semiconductor device of claim 1, wherein the first selector structure has a first side surface and a second side surface opposed to each other, and
   the first upper data storage electrode is disposed to be closer to the first side surface of the first selector structure than to the second side surface of the first selector structure.

7. The semiconductor device of claim 6, wherein the first selector structure includes a first lower selector electrode, a first selector pattern, and a first upper selector electrode, sequentially arranged in a direction perpendicular to the surface of the substrate, and
   the first lower selector electrode is a threshold switching device.

8. The semiconductor device of claim 1, further comprising:
   a third conductive line disposed on the second conductive line and overlapping the first conductive line; and
   a second data storage structure and a second selector structure interposed between the second conductive line and the third conductive line and connected in series.

9. The semiconductor device of claim 8, wherein the second data storage structure includes a second lower data storage electrode, a second data storage pattern disposed on the second lower data storage electrode, and a second upper data storage electrode disposed on the second data storage pattern,
   the second lower data storage electrode includes a first portion facing the second upper data storage electrode and vertically aligned with the second upper data storage electrode, and
   the first portion of the second lower data storage electrode has the same width in the second direction and the same length in the first direction as the second upper data storage electrode.

10. The semiconductor device of claim 9, wherein the first lower data storage electrode includes a second portion extending from a bottom of the first portion of the first lower data storage electrode in the first direction, and
    the second lower data storage electrode includes a second portion extending from a bottom of the first portion of the second lower data storage electrode in the second direction.

11. The semiconductor device of claim 9, wherein the first data storage pattern includes a first data storage region in contact with the first lower data storage electrode, and
    the second data storage pattern includes a second data storage region in contact with the second upper data storage electrode.

12. A semiconductor device, comprising:
    a first conductive line disposed on a substrate and extending in a first direction, parallel to a surface of the substrate;
    a second conductive line disposed on the first conductive line and extending in a second direction, perpendicular to the first direction and parallel to the surface of the substrate; and
    a first data storage structure interposed between the first conductive line and the second conductive line,
    wherein the first data storage structure includes a first lower data storage electrode, a first data storage pattern, and a first upper data storage electrode, sequentially arranged in a direction perpendicular to the surface of the substrate,
    the first data storage pattern includes a first side surface and a second side surface facing each other, and
    the first upper data storage electrode is disposed closer to the first side surface of the first data storage pattern than to the second side surface of the first data storage pattern.

13. The semiconductor device of claim 12, wherein the first upper data storage electrode and the first lower data storage electrode face each other, and facing surfaces of the first upper data storage electrode and the first lower data storage electrode have the same size.

14. The semiconductor device of claim 12, further comprising:
a third conductive line disposed on the second conductive line and overlapping the first conductive line; and
a second data storage structure interposed between the second conductive line and the third conductive line,
wherein the second data storage structure includes a second lower data storage electrode, a second data storage pattern, and a second upper data storage electrode, sequentially arranged in a direction perpendicular to the surface of the substrate,
the first lower data storage electrode includes a first portion in contact with the first data storage pattern and a second portion extending from a bottom of the first portion and in contact with the first conductive line in the first direction,
the second lower data storage electrode includes a first portion in contact with the second data storage pattern and a second portion extending from a bottom of the first portion in the second direction and in contact with the second conductive line, and
widths in the first direction of the first upper data storage electrode and the first portion of the first lower data storage electrode are the same as widths in the second direction of the second upper data storage electrode and the first portion the second lower data storage electrode.

15. The semiconductor device of claim 14, further comprising:
a first selector structure interposed between the first data storage structure and the second conductive line; and
a second selector structure interposed between the second data storage structure and the third conductive line,
wherein the first and second selector structures include threshold switching devices, and
the first and second data storage patterns are formed of a phase change material.

16. A semiconductor device, comprising:
a first word line disposed on a substrate and extending in a first direction, parallel to a surface of the substrate;
a bit line disposed on the first word line and extending in a second direction, perpendicular to the first direction and parallel to the surface of the substrate;
a second word line disposed on the bit line and extending in the first direction;
a first data storage structure between the first word line and the bit line; and
a second data storage structure between the bit line and the second word line,
wherein the first data storage structure includes a first lower data storage electrode, a first data storage pattern, and a first upper data storage electrode, sequentially arranged in a direction perpendicular to the surface of the substrate,
a first portion of the first lower data storage electrode has a width in the first direction and a length in the second direction greater than the width in the first direction,
the first upper data storage electrode has the same width in the first direction and the same length in the second direction as the first portion of the first lower data storage electrode, and
a width of the first data storage pattern in the first direction is greater than the width of the first portion of the first lower data storage electrode in the first direction.

17. The semiconductor device of claim 16, wherein the first upper data storage electrode is self-aligned to the first portion of the first lower data storage electrode.

18. The semiconductor device of claim 16, wherein the second data storage structure includes a second lower data storage electrode, a second data storage pattern disposed on the second lower data storage electrode, and a second upper data storage electrode disposed on the second data storage pattern, and
the second data storage structure has a shape formed by rotating the same structure as the first data storage structure 90 degrees in a direction parallel to the surface of the substrate.

19. The semiconductor device of claim 18, further comprising:
a first selector structure between the first data storage structure and the bit line; and
a second selector structure between the second data storage structure and the first word line,
wherein the first data storage pattern includes a first data storage region in contact with the first lower data storage electrode, and
the second data storage pattern includes a second data storage region in contact with the second upper data storage electrode.

20. The semiconductor device of claim 16, wherein the first lower data storage electrode includes a second portion extending from a bottom of the first portion of the first lower data storage electrode and in contact with the first word line in the first direction.

* * * * *